(12) United States Patent
Kim

(10) Patent No.: US 9,520,490 B2
(45) Date of Patent: Dec. 13, 2016

(54) SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventor: Che-heung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 14/320,037

(22) Filed: Jun. 30, 2014

(65) Prior Publication Data

US 2015/0155377 A1 Jun. 4, 2015

(30) Foreign Application Priority Data

Dec. 3, 2013 (KR) .................. 10-2013-0149497

(51) Int. Cl.
| | |
|---|---|
| *H01L 29/66* | (2006.01) |
| *H01L 29/778* | (2006.01) |
| *H01L 29/40* | (2006.01) |
| *H01L 29/16* | (2006.01) |
| *H01L 29/20* | (2006.01) |
| *H01L 21/8252* | (2006.01) |

(Continued)

(52) U.S. Cl.
CPC ....... *H01L 29/7786* (2013.01); *H01L 21/8252* (2013.01); *H01L 27/0207* (2013.01); *H01L 27/0605* (2013.01); *H01L 27/085* (2013.01); *H01L 29/1608* (2013.01); *H01L 29/2003* (2013.01); *H01L 29/402* (2013.01); *H01L 29/66431* (2013.01); *H01L 29/66462* (2013.01)

(58) Field of Classification Search
USPC .................. 257/192, 355, 196, 201, 76, E21.509,257/E29.089, 194
See application file for complete search history.

(56) References Cited

U.S. PATENT DOCUMENTS

| 7,466,012 B2 | 12/2008 | Standing et al. |
| 8,203,376 B2 * | 6/2012 | Morita ................ H01L 27/0605 327/427 |

(Continued)

FOREIGN PATENT DOCUMENTS

| JP | 4663981 B2 | 4/2011 |
| KR | 1998-024683 | 7/1998 |
| KR | 2000-0069747 | 11/2000 |

OTHER PUBLICATIONS

David Clayton Reusch, High Frequency, High Power Density Integrated Point of Load and Bus Converters, Dissertation submitted to the faculty of the Virginia Polytechnic Institute and State University, 2012, 1-207.

*Primary Examiner* — Telly Green
(74) *Attorney, Agent, or Firm* — Harness, Dickey & Pierce, P.L.C.

(57) ABSTRACT

A semiconductor device and a method of manufacturing the semiconductor device are provided. The semiconductor device is a half bridged field effect transistor having a monolithic chip, and includes a semiconductor substrate with a 2-dimensional electron gas layer formed therein; a drain electrode formed on the semiconductor substrate; a first gate electrode, an output electrode, a second gate electrode, and a source electrode. The method of manufacturing the semiconductor device uses a method of monolithically forming a stack structure, which implements a half bridge function, on a substrate according to semiconductor processes.

18 Claims, 23 Drawing Sheets

(51) Int. Cl.
*H01L 27/02* (2006.01)
*H01L 27/06* (2006.01)
*H01L 27/085* (2006.01)

(56) References Cited

U.S. PATENT DOCUMENTS

| | | | |
|---|---|---|---|
| 8,227,794 B2 * | 7/2012 | Otsuji | H01L 21/8213 257/29 |
| 8,404,508 B2 | 3/2013 | Lidow et al. | |
| 8,450,146 B2 * | 5/2013 | Tanaka | H01L 23/053 438/105 |
| 8,497,553 B2 * | 7/2013 | Yamagiwa | H01L 27/0266 257/192 |
| 2007/0114569 A1 * | 5/2007 | Wu | H01L 29/207 257/194 |
| 2007/0164423 A1 | 7/2007 | Standing | |
| 2010/0097105 A1 * | 4/2010 | Morita | H01L 27/0605 327/109 |
| 2011/0181350 A1 * | 7/2011 | Takagi | H01L 23/66 327/564 |
| 2011/0193171 A1 * | 8/2011 | Yamagiwa | H01L 27/0266 257/355 |
| 2011/0297960 A1 * | 12/2011 | Tanaka | H01L 23/053 257/76 |

* cited by examiner

SEMICONDUCTOR DEVICE AND METHOD OF MANUFACTURING THE SAME

RELATED APPLICATIONS

This application claims priority from Korean Patent Application No. 10-2013-0149497, filed on Dec. 3, 2013, in the Korean Intellectual Property Office, the disclosure of which is incorporated herein in its entirety by reference.

BACKGROUND

1. Field

Example embodiments relate to semiconductor devices and/or methods of manufacturing the semiconductor devices.

2. Description of the Related Art

A power device for controlling the flow of electric current through ON/OFF switching is required for various power conversion systems. In the power conversion systems, the efficiency of the power device may influence the efficiency of the entire system.

Examples of currently commercialized power devices include metal-oxide-semiconductor field-effect transistors (MOSFETs) and insulated gate bipolar transistors (IGBTs). It is typically difficult to increase the efficiency of a silicon-based power device due to limitations on the physical properties of silicon and limitations on the manufacturing process.

Recently, attempts to apply a compound semiconductor of III-V group to a power device have been made to increase conversion efficiency. In this regard, a high electron mobility transistor (HEMT) using a heterojunction structure of the compound semiconductor is receiving attention because the HEMT includes semiconductor layers having different electrical polarization characteristics. A semiconductor layer having relatively large polarizability from among the semiconductor layers may induce a 2-dimensional electron gas layer in another semiconductor layer joined thereto, and the 2-dimensional electron gas layer may have very high electron mobility.

SUMMARY

At least one example embodiment relates to semiconductor devices with which high efficiency power devices may be implemented.

At least one example embodiment relates to methods of manufacturing the semiconductor devices.

Additional example embodiments will be set forth in part in the description which follows and, in part, will be apparent from the description, or may be learned by practice of the presented example embodiments.

According to at least one example embodiment, a semiconductor device includes a substrate; a first semiconductor layer formed on the substrate; a second semiconductor layer formed on the first semiconductor layer, the second semiconductor layer inducing a 2-dimensional electron gas layer in the first semiconductor layer; a drain electrode, a source electrode, and a first gate electrode, which are formed on the second semiconductor layer and constitute a first transistor along with the 2-dimensional electron gas layer; a drain electrode, a source electrode, and a second gate electrode, which are formed on the second semiconductor layer and constitute a second transistor along with the 2-dimensional electron gas layer; and an output electrode formed by merging the source electrode of the first transistor and the drain electrode of the second transistor.

The first transistor, the output electrode, and the second transistor may constitute a half-bridged field effect transistor (HBFET) cell.

A distance between the source electrode of the first transistor and the drain electrode of the first transistor may be different from the distance between the source electrode of the second transistor and the drain electrode of the second transistor.

The HBFET cell may include a plurality of HBFET cells, wherein the plurality of HBFET cells are disposed to implement an integrated HBFET.

The drain electrode of the first transistor, the first gate electrode, the output electrode, the second gate electrode, and the source electrode of the second transistor may constitute a pentode unit, and a plurality of pentode units may be provided on the substrate.

The plurality of pentode units may be disposed to be repeatedly mirror-symmetrical at a terminal electrode of each of the plurality of pentode units. In other words, the plurality of pentode units may be configured to be symmetrical with respect to a terminal electrode of each of the plurality of pentode units, and a terminal electrode may be, for example, a source of the second transistor or a drain of the first transistor.

According to at least one example embodiment, the semiconductor device may further include a first electrode pad that connects drain electrodes of a plurality of first transistors included in the plurality of pentode units to one another, an output electrode pad that connects a plurality of output electrodes included in the plurality of pentode units to one another, and a second electrode pad that connects source electrodes of a plurality of second transistors included in the plurality of pentode units to one another.

An insulating layer entirely covering the plurality of pentode units may be disposed, and the drain electrodes of the plurality of first transistors, the plurality of output electrodes, and the source electrodes of the plurality of second transistors may be connected to the first electrode pad, the output electrode pad, and the second electrode pad, respectively, through contact holes penetrating the insulating layer.

The output electrode pad may have the largest area among the first electrode pad, the output electrode pad, and the second electrode pad.

An area of the second electrode pad may be larger than the area of the first electrode pad.

The first electrode pad, the output electrode pad, and the second electrode pad may be disposed on the same surface of the semiconductor device, so that the first electrode pad, the output electrode pad, and the second electrode pad may be flip chip-bonded to a predetermined board.

Solder bumps may be further disposed on the first electrode pad, the output electrode pad, and the second electrode pad.

An insulating partition may be further disposed between each of the pads, i.e., the first electrode pad, the output electrode pad, and the second electrode pad.

According to another example embodiment, a semiconductor device includes a semiconductor substrate with a 2-dimensional electron gas layer formed therein, first and second gate electrodes formed on the semiconductor substrate, wherein the first gate electrode includes a plurality of first gate lines spaced apart from one another and the second gate electrode includes a plurality of second gate lines disposed to be interlocked with the plurality of first gate lines, a plurality of drain electrodes and source electrodes, which constitute a plurality of first transistors along with the plurality of first gate lines and the 2-dimensional electron gas layer, and a plurality of drain electrodes and source electrodes, which constitute a plurality of second transistors along with the plurality of second gate lines and the 2-dimensional electron gas layer, wherein the plurality of drain electrodes and source electrodes of the plurality of first transistors, and the plurality of drain electrodes and source electrodes of the plurality of second transistors, are disposed on a plurality of areas between the plurality of first and second gate lines.

In the plurality of first transistors and the plurality of second transistors, a source electrode of a first transistor and a drain electrode of a second transistor, which are adjacent to each other, may be merged to form an output electrode.

The plurality of first transistors, a plurality of output electrodes, and the plurality of second transistors may constitute an integrated half bridge cell.

The first gate electrode may further include a first connection portion that connects ends of the plurality of first gate lines to one another, and the second gate electrode may further include a second connection portion that connects ends of the plurality of second gate lines to one another.

The semiconductor device may further include a first electrode pad to which the drain electrodes of the plurality of first transistors are connected, an output electrode pad to which the plurality of output electrodes are connected, and a second electrode pad to which the source electrodes of the plurality of second transistors are connected.

The semiconductor device may further include, a first gate pad connected to the first connection portion and a second gate pad connected to the second connection portion.

The drain electrodes of the plurality of first transistors, the plurality of output electrodes, and the source electrodes of the plurality of second transistors may be repeatedly disposed in a predetermined regulation in a direction intersecting the plurality of first gate lines and the plurality of second gate lines.

The predetermined regulation may be determined according to a channel area ratio between two equivalent switches forming the integrated half bridge cell.

The drain electrodes of the plurality of first transistors and the source electrodes of the plurality of second transistors may be repeatedly disposed in different cycles.

The drain electrodes of the plurality of first transistors, the plurality of output electrodes, and the source electrodes of the plurality of second transistors may be mirror-symmetrically and repeatedly disposed.

The first gate electrode and the second gate electrode may be disposed so that the plurality of first gate lines and the plurality of second gate lines are disposed to be interlocked with each other by two.

A passivation layer entirely covering the first gate electrode and the second gate electrode may be further disposed, and the semiconductor device may further include a field plate extending from any one of a drain electrode, an output electrode, and a source electrode onto the passivation layer on an adjacent first gate line or adjacent second gate line.

The semiconductor substrate may include a substrate, a first semiconductor layer formed on the substrate, a second semiconductor layer formed on the first semiconductor layer, the second semiconductor layer inducing the 2-dimensional electron gas layer in the first semiconductor layer.

The first semiconductor layer may include at least one of GaN, InN, and GaAs.

The second semiconductor layer may include at least one of AlGaN, AlInN, and AlGaAs.

The semiconductor device may further include a buffer layer between the substrate and the first semiconductor layer.

According to another example embodiment, a method of manufacturing a semiconductor device includes monolithically forming a stack structure, which implements a half bridge function, on a substrate according to semiconductor processes.

The substrate may be a semiconductor substrate with a 2-dimensional electron gas layer formed therein.

The stack structure may include a plurality of half-bridged field effect transistor (HBFET) cells that form an integrated HBFET.

The forming of the stack structure may include forming a first gate electrode and a second gate electrode on the semiconductor substrate, forming a drain electrode, an output electrode, and a source electrode, so as to be spaced apart from the first and second gate electrodes, on the semiconductor substrate, and forming a first electrode pad, an output electrode pad, and a second electrode pad which are connected to the drain electrode, the output electrode, and the source electrode, respectively.

BRIEF DESCRIPTION OF THE DRAWINGS

These and/or other aspects will become apparent and more readily appreciated from the following description of the embodiments, taken in conjunction with the accompanying drawings in which:

FIG. 8A is a graph showing comparison results between switching characteristics of the semiconductor device of FIG. 6 according to an example embodiment and switching characteristics of a semiconductor device according to a comparison example, when the semiconductor device is switching on;

DETAILED DESCRIPTION

Figure 1:
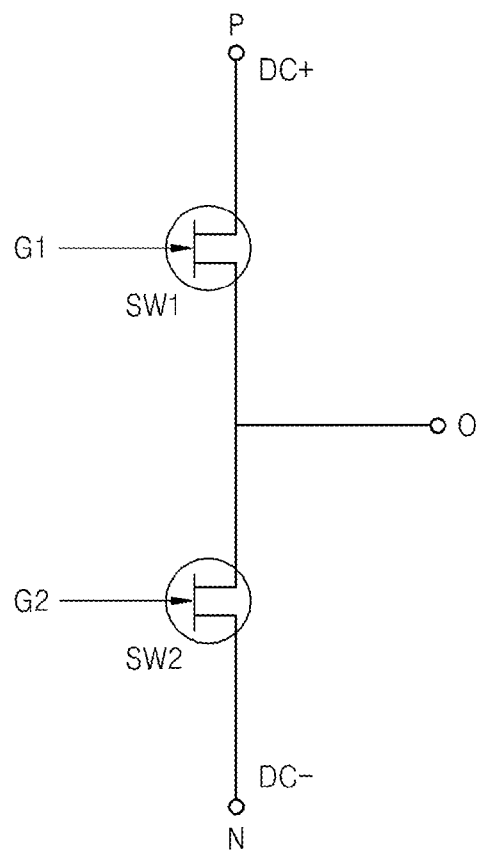
FIG. 1 is a circuit diagram of an ideal half bridged transistor, according to at least one example embodiment.

Example embodiments may be embodied in many different forms. Thus, example embodiments will be illustrated in the drawings and described in the present disclosure in detail. The effects and features of the example embodiments and methods of accomplishing the example embodiments will be apparent from these embodiments set forth herein, together with the accompanying drawings. However, the example embodiments are not limited and may be embodied in various forms.

Hereinafter, example embodiments will be described in detail with reference to the accompanying drawings. When the example embodiments are described with reference to the drawings, the same or corresponding constitutional elements will be assigned the same reference numerals and will thus not be redundantly described herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

As used herein, the term "and/or" includes any and all combinations of one or more of the associated listed items.

In the example embodiments set forth herein, the terms 'first', 'second', etc., are only used to distinguish one element, component, region, layer, or section from another element, component, region, layer, or section. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that The terms 'comprise' and/or 'comprising' specify the presence of stated features, integers, steps, operations, elements, and/or components but do not preclude the presence or addition of one or more other features, integers, steps, operations, elements, components, and/or groups thereof.

In the drawings, the lengths and sizes of layers and regions may be exaggerated for clarity. For example, the sizes and thicknesses of layers and regions are arbitrarily illustrated in the drawings for convenience of explanation and thus the present invention is not limited thereto.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

When an example embodiment may be accomplished in a different way, a particular process may be performed in an order that is different from that described in the present disclosure. For example, two processes described continuously may be actually simultaneously performed or may be performed in a reverse order.

Semiconductor devices according to example embodiments are half bridged field effect transistors (HBFETs) that may be applied to high efficiency power devices, and first, a circuit and a function of a half bridged transistor are described.

Figure 2:
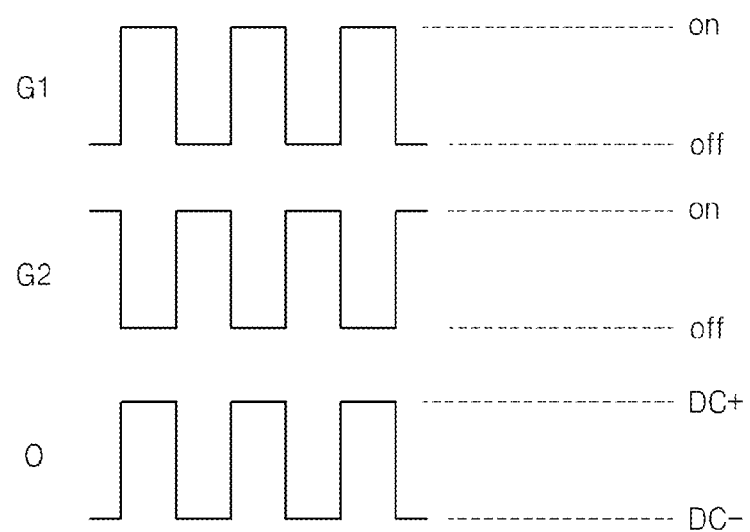
FIG. 2 is a waveform diagram for explaining a half bridged function that is performed in the half bridged transistor of FIG. 1.

FIG. 1 is a circuit diagram of an ideal half bridged transistor according to at least one example embodiment, and FIG. 2 is a waveform diagram for explaining a half bridged function that is performed in the half bridged transistor of FIG. 1.

According to at least one example embodiment, half bridge structure has a form in which two active switches SW1 and SW2 are connected in series, performs a function of periodically sampling high and low DC values, and may be widely applied to most of power devices, such as a inverter phase leg, a synchronous rectifier, a synchronous buck, a synchronous boost converter, and the like.

According to at least one example embodiment, a relatively high electrical signal DC+ is connected to a drain of the active switch SW1, and a relatively low electrical signal DC− is connected to a source of the active switch SW2. A source of the active switch SW1 and a drain of the active switch SW2 are connected to each other, and an output signal O is output from the connection point.

According to at least one example embodiment, the high electrical signal DC+ and the low electrical signal DC− are alternately output according to a signal which is applied to a gate G1 of the active switch SW1, and a signal which is applied to a gate G2 of the active switch SW2. That is, when an electrical signal that may form a channel of a transistor forming the active switch SW1, that is, a voltage value that is equal to or greater than a threshold voltage of the transistor, is applied to the gate G1 and an electrical signal is not applied to the gate G2, the active switch SW1 is turned on and the active switch SW2 is turned off, and thus, the high electrical signal DC+ is output. When an electrical signal is not applied to the gate G1 and a voltage value that is equal to or greater than the threshold voltage is applied to the gate G2, the active switch SW1 is turned off and the active switch SW2 is turned on, and thus, the low electrical signal DC− is output.

As illustrated in FIG. 2, the output signal O may be changed from the low electrical signal DC− to the high electrical signal DC+ in correct synchronization with electrical signals applied to the gates G1 and G2. However, the output signal O has a finite switching speed and a predetermined transient period due to various parasitic components.

Figure 3:
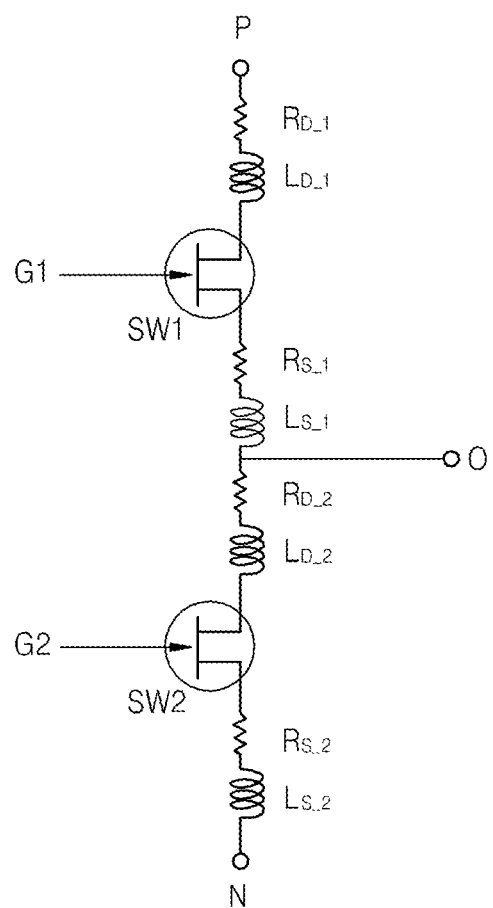
FIG. 3 is an equivalent circuit of a half bridged transistor including various parasitic components actually occurring therein.

FIG. 3 is an equivalent circuit of a half bridged transistor including various parasitic components actually occurring therein.

As illustrated in FIG. 3, in an actual half bridge structure, parasitic components, such as resistance and inductance, inevitably occurs due to causes, such as a device package, interconnection with a board, physical geometry, and the like. Such parasitic components hinder ideal operations of the switches SW1 and SW2 and cause a switching loss, and thus provide serious and direct cause to reduce the efficiency of a power system using the half bridged transistor.

Among various parasitic components, the inductance of the sources of the switches SW1 and SW2 in particular reduces an effective control voltage due to the voltage induction of the sources, and thus reduces a switching speed and increases a transient period, thereby most significantly increasing the switching loss.

According to results of simulations performed by diversifying values of parasitic components with respect to a general synchronous buck converter circuit using the half bridged transistor, it is determined that among the various parasitic components, the increase of the inductance most significantly increases a power loss. Particularly, the inductance of a source is more sensitive to the power loss than loop inductance that is the sum of inductances of the entire circuit, and thus, a design for reducing a value of the source inductance is important for an actual application.

Furthermore, in the case of the half bridged transistor that is applied to the power devices, signals have to be alternately applied to the gate G1 and the gate G2 so that the active switch SW2 is turned on after the switch SW1 is completely turned off. To this end, in actual applications, unlike in FIG. 2, a signal having an "off" voltage is applied to the gate G1, and then, after a predetermined dead time, a signal is applied to the gate G2. Accordingly, a transient period of the output signal O becomes longer. That is, the switching speed of the half bridged transistor that is applied to power devices is highly needed to be reduced, and the reduction of the source inductance greatly increases the switching speed although the amount of the reduction of the source inductance is small.

A semiconductor device according to an example embodiment has a structure in which a stack structure for implementing a half bridge function may be monolithically formed on a substrate according to semiconductor processes, so as to reduce the source inductance.

Figure 4:
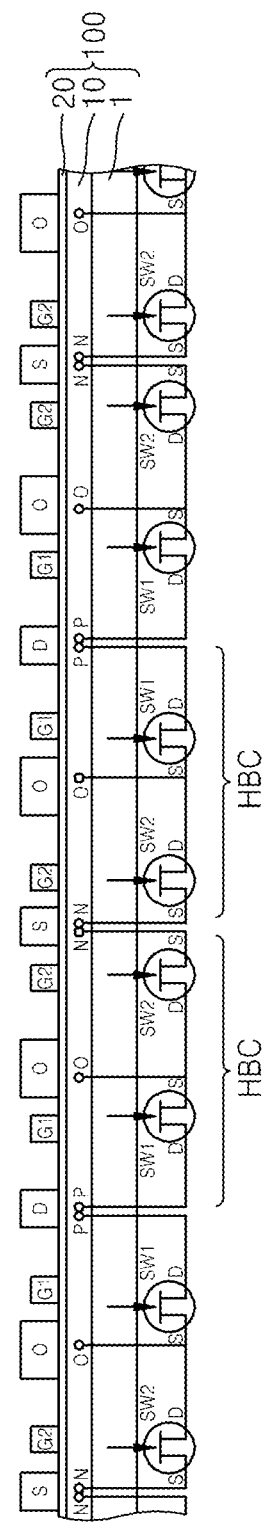
FIG. 4 is a conceptual diagram for explaining that a semiconductor device according to an example embodiment implements a stack structure performing a half bridge function.
Figure 5:
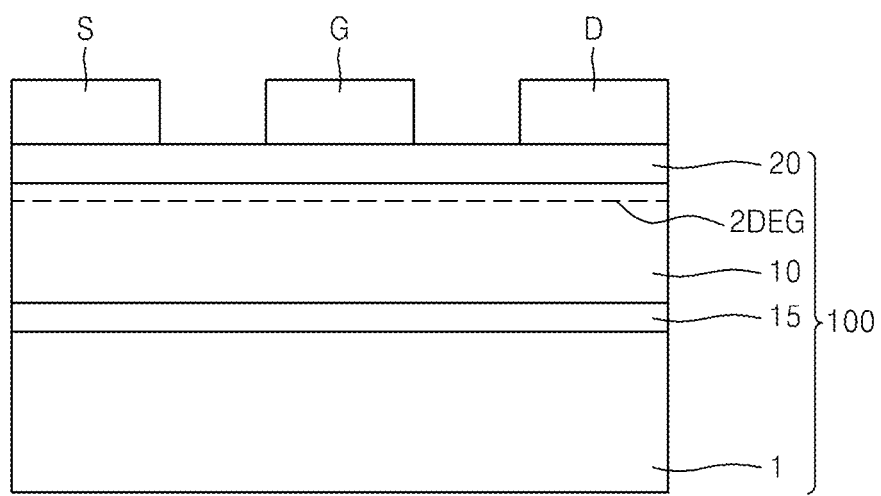
FIG. 5 is a cross-sectional view showing in detail a switch device used in FIG. 4.

FIG. 4 is a conceptual diagram for explaining that a semiconductor device according to an example embodiment implements a stack structure performing a half bridge function, and FIG. 5 is a cross-sectional view showing in detail a switch device used in FIG. 4.

First, a structure of a HEMT adopted as the switch device is described with reference to FIG. 5, according to at least one example embodiment.

The HEMT includes a source electrode S, a gate electrode G, and a drain electrode D, which are formed apart from one another on a semiconductor substrate 100.

The semiconductor substrate 100 is a substrate with a 2-dimensional electron gas layer 2DEG functioning as a channel of a transistor, and includes a substrate 1, a first semiconductor layer 10, and a second semiconductor layer 20.

The substrate 1 may be a substrate formed of sapphire, Si, SiC, GaN, or the like.

The first semiconductor layer 10 may include a semiconductor of the III-V group. For example, the semiconductor layer 10 may include GaN, InN, GaAs, and the like. The first semiconductor layer 10 may be an undoped layer or a layer doped with impurities. The first semiconductor layer 10 may be formed by epitaxial growth and for example, may be formed by using metal-organic chemical vapor deposition (MOCVD) equipment. A buffer layer 15 may be further provided between the substrate 1 and the semiconductor layer 10. The buffer layer 15 reduces differences in lattice constant and thermal expansion coefficient between the substrate 1 and the first semiconductor layer 10 to prevent the deterioration of the crystallinity of the first semiconductor layer 10. The buffer layer 15 may be formed of, for example, AlN, GaN, AlGaN, AlInN, AlGaInN, and the like.

According to at least one example embodiment, the second semiconductor layer 20 is formed on the first semiconductor layer 10, and is formed of a material that may induce the 2-dimensional electron gas layer 2DEG in the first semiconductor layer 10. Similarly to the first semiconductor layer 10, the second semiconductor layer 20 also may be formed by epitaxial growth, and may be formed by using the MOCVD equipment. The second semiconductor layer 20 may include a III-V group semiconductor. For example, the second semiconductor layer 20 may include AlGaN, AlInN, AlGaAs, and the like. AlGaN, AlInN, AlGaAs, and the like have larger polarizability than the first semiconductor layer 10, and thus may induce the 2-dimensional electron gas layer 2DEG in the first semiconductor layer 10. When the first semiconductor layer 10 is a GaN layer, the second semiconductor layer 20 may be an AlGaN layer or an AlInN layer. When the first semiconductor layer 10 is an InN layer, the second semiconductor layer 20 may be an AlInN layer. When the first semiconductor layer 10 is a GaAs layer, the second semiconductor layer 20 may be an AlGaAs layer. However, the above-stated materials of the first and second semiconductor layers 10 and 20 are examples, and may be variously changed. The second semiconductor layer 20 may be a layer doped with n-type impurities. The n-type impurities may be, for example, Si. Also, the second semiconductor layer 20 may have a multi-layered structure including a plurality of material layers that are different from each other.

The 2-dimensional electron gas layer 2DEG that is formed in the first semiconductor layer 10 by the second semiconductor layer 20 may have high electron density. In addition, the electron density of the 2-dimensional electron gas layer 2DEG formed in the first semiconductor layer 10 may be increased by performing a heat treatment process on the first semiconductor layer 10.

In FIG. 5, the gate electrode G is formed on a predetermined area of the second semiconductor layer 20, and the source electrode S and the drain electrode D are formed at both sides of the gate electrode G1 on the second semiconductor layer 20.

FIG. 5 illustrates a basic structure of the HEMT adopted in the semiconductor device according to an example embodiment, and the basic structure may be variously modified. For example, a gate insulating layer (not shown) or a depletion layer (not shown) may be further provided between the gate electrode G and the second semiconductor layer 20. In addition, a portion of the second semiconductor layer 20 in which the gate electrode G is formed may be recessed up to a predetermined depth to form a recess area (not shown), and then a gate electrode G may be formed in the recess area. In this case, characteristics of the 2-dimensional electron gas layer 2DEG corresponding to the recess area may be changed, and as a result, characteristics of the HEMT may be adjusted. Besides, various modifications may be made.

Referring to FIG. 4, a plurality of HBFET cells HBC may be formed in parallel on the semiconductor substrate 100. Each of the plurality of HBFET cells HBC may include two switches SW1 and SW2 connected in series, and a source electrode S of the switch SW1 and a drain electrode D of the switch SW2 may be merged to form an output electrode O.

According to at least one example embodiment, the switch SW1 is formed of a transistor that includes a first gate electrode G1 and drain and source electrodes D and S formed apart from each other at both sides of the first gate electrode G1 and uses a 2-dimensional electron gas layer formed on the semiconductor substrate 100 as a channel. The switch SW2 also includes a second gate electrode G2 and drain and source electrodes D and S formed apart from each other at both sides of the second gate electrode G2. The two switches SW1 and SW2 are connected in series, and in FIG. 4, a portion in which the drain electrode D and the source electrode S are merged to form an output is illustrated as the output electrode O.

In order to form the plurality of HBFET cells HBC, the drain electrode D of the switch SW1, the first gate electrode G1, the output electrode O, the second gate electrode G2, and the source electrode S of the switch SW2 form a pentode unit, and such a pentode unit is repeatedly disposed on the semiconductor substrate 100. As illustrated in FIG. 4, a plurality of pentode units are disposed to be repeatedly mirror-symmetrical at terminal electrodes, i.e., drain electrodes D of switches SW1 or source electrodes S of switches SW2.

However, the disposition illustrated in FIG. 4 is an example, and may be variously modified. For example, the disposition illustrated in FIG. 4 has a form in which channel areas of transistors forming the two switches SW1 and SW2 of each HBFET cell HBC are the same as each other and channel areas of two equivalent switches forming an integrated HBFET are also the same as each other. However, if necessary, one of the channel areas may be larger than the other of the channel areas. To this end, the transistors forming the two switches SW1 and SW2 of each HBFET cell HBC may be formed to have different channel areas. For example, a distance between the source electrode and the drain electrode of the transistor forming the switch SW1 may be different from that between the source electrode and the drain electrode of the transistor forming the switch SW2. In addition, by making the number of drain electrodes and the number of source electrodes different from each other, the channel areas of the two equivalent switches forming an integrated HBFET may be different from each other. A detailed example of the above structure will be described with reference to FIG. 13 later.

Figure 6:
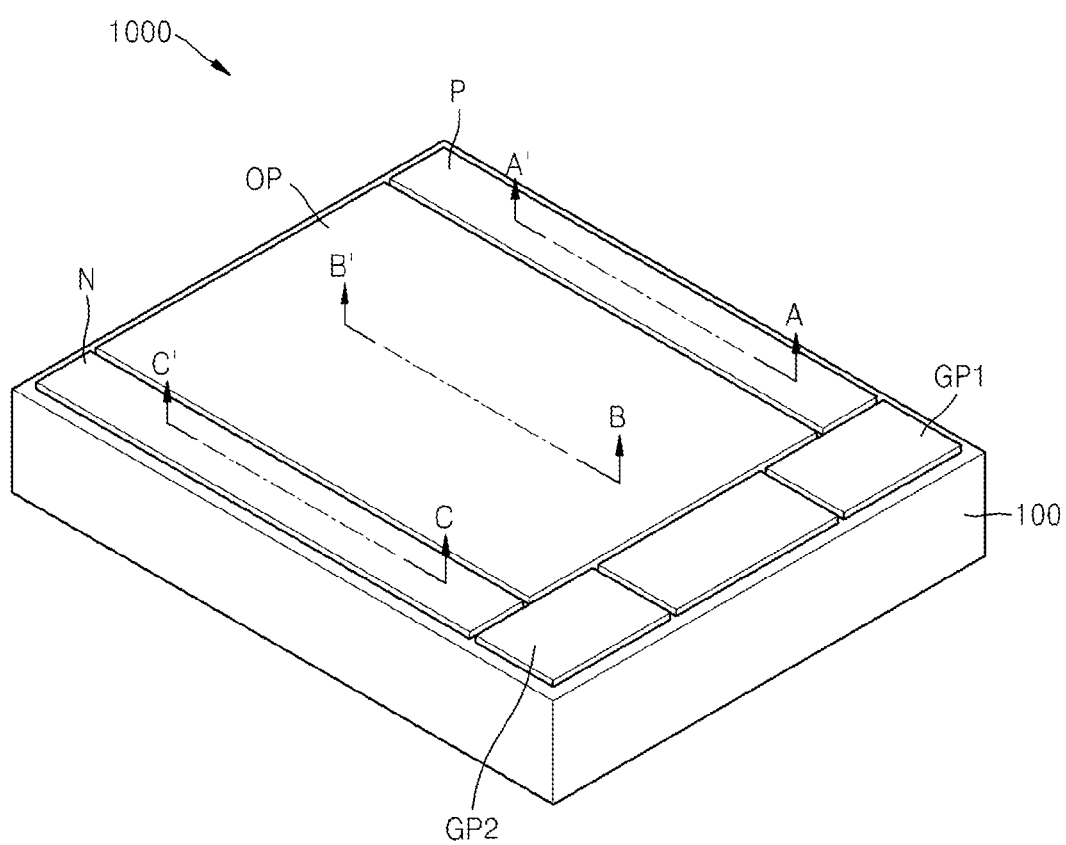
FIG. 6 is a perspective view showing an outward shape of a semiconductor device according to an example embodiment.
Figure 7A:
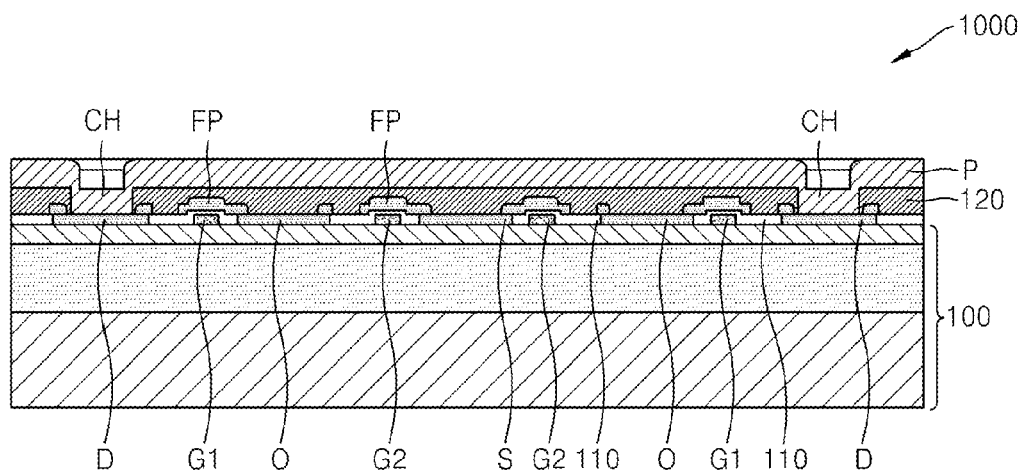
FIG. 7A is a cross-sectional view taken along a line A-A' of FIG. 6.
Figure 7B:
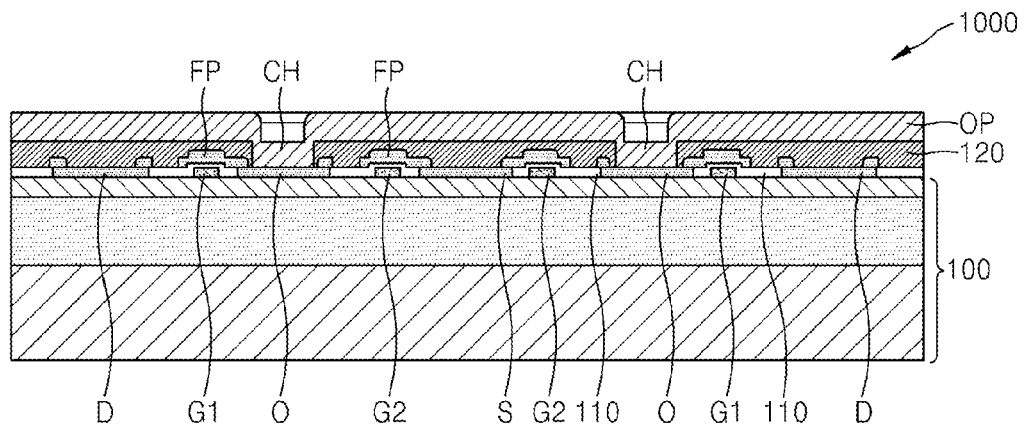
FIG. 7B is a cross-sectional view taken along a line B-B' of FIG. 6.
Figure 7C:
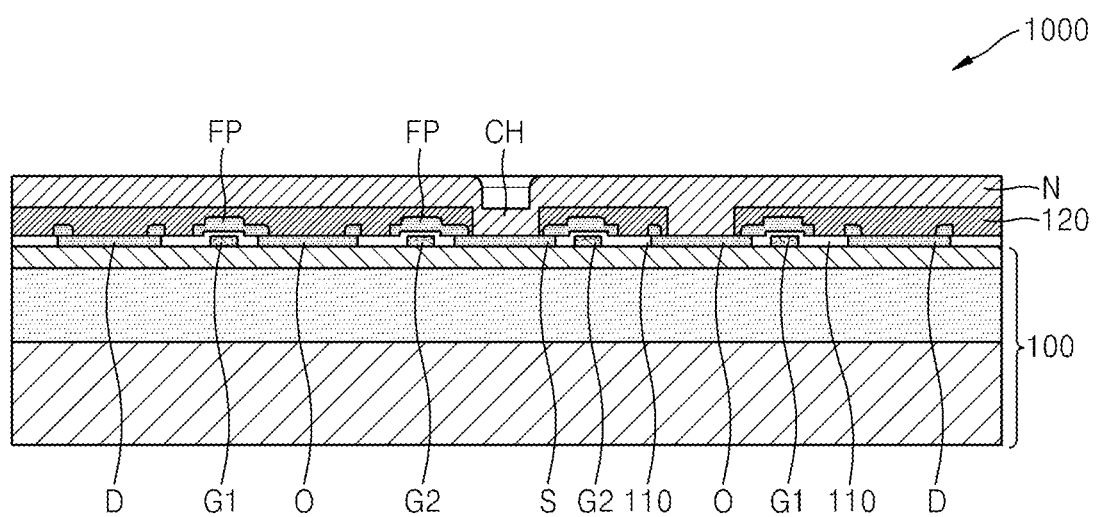
FIG. 7C is a cross-sectional view taken along a line C-C' of FIG. 6.

FIG. 6 is a perspective view showing an outward shape of a semiconductor device 1000 according to an example embodiment. FIG. 7A is a cross-sectional view taken along a line A-A' of FIG. 6, FIG. 7B is a cross-sectional view taken along a line B-B' of FIG. 6, and FIG. 7C is a cross-sectional view taken along a line C-C' of FIG. 6.

Referring to FIG. 6, the semiconductor device 1000 has an outward shape in which a HBFET is implemented to have the form of a monolithic chip. A first electrode pad P, a second electrode pad N, an output electrode pad OP, a first gate pad GP1, and a second gate pad GP2 are disposed on an upper surface of a chip. Drain electrodes of HBFET cells forming an integrated HBFET are connected to the first electrode pad P, output electrodes of the HBFET cells are connected to the output electrode pad OP, and source electrodes of the HBFET cells are connected to the second electrode pad N. The first gate electrode G1 is connected to the first gate pad GP1, and the second gate electrode G2 is connected to the second gate pad GP2.

The output electrode pad OP may be formed to have the largest area among the first electrode pad P, the output electrode pad OP, and the second electrode pad N, and the second electrode pad N may be formed to have a smaller area than the first electrode pad P in order to reduce parasitic source inductance.

In addition, as illustrated in FIG. 6, the first electrode pad P, the output electrode pad OP, and the second electrode pad N may be formed on the same surface of the semiconductor device 1000 so as to be easily flip chip-bonded to a predetermined circuit board. In addition, the first gate pad GP1 and the second gate pad GP2 may be formed on the same surface. However, the example embodiments are not limited thereto.

A detailed structure is described below with reference to FIGS. 7A through 7C, according to at least one example embodiment.

The semiconductor substrate 100 includes a 2-dimensional electron gas layer as described with reference to FIG. 4.

According to at least one example embodiment, a passivation layer 110, which entirely covers the first gate electrode G1 and the second gate electrode G2, is formed, and a field plate FP is further formed on the passivation layer 110 and is connected to a source electrode S or an output electrode O. The field plate FP disperses an electric field between a gate electrode and a source electrode. More specifically, an electric field may be concentrated on an edge portion of the first gate electrode G1 between the first gate electrode G1 and the output electrode O, and on an edge portion of the second gate electrode G2 between the second gate electrode G2 and the source electrode S. When the field plate FP, which extends from the output electrode O onto the top of the first gate electrode G1 and extends from the source electrode S onto the top of the second gate electrode G2, are disposed, such an electric field concentration may be alleviated. Accordingly, a breakdown may be suppressed, and withstand voltage characteristics may be improved. Although the field plate FP extends from the source electrode S onto the top of the second gate electrode G2 and from the output electrode O onto the top of the first gate electrode G1 as shown in FIG. 7A through 7C, the example embodiments are not limited thereto. For example, the field plate FP may extend from the drain electrode D onto the top of the first gate electrode G1 and extend from the output electrode O to the top of the second gate electrode G2.

An insulating layer 120, which entirely covers the drain electrode D, the first gate electrode G1, the output electrode O, the second gate electrode G2, the source electrode S, and the field plate FP, is disposed, and a plurality of contact holes CH penetrating the insulating layer 120 are formed. The contact holes CH electrically expose the drain electrode D, the output electrode O, and the source electrode S to the outside. Through the plurality of contact holes CH, a plurality of drain electrodes D are connected to the first electrode pad P, a plurality of output electrodes O are connected to the output electrode pad OP, and a plurality of source electrodes S are connected to the second electrode pad N.

Figure 8A:
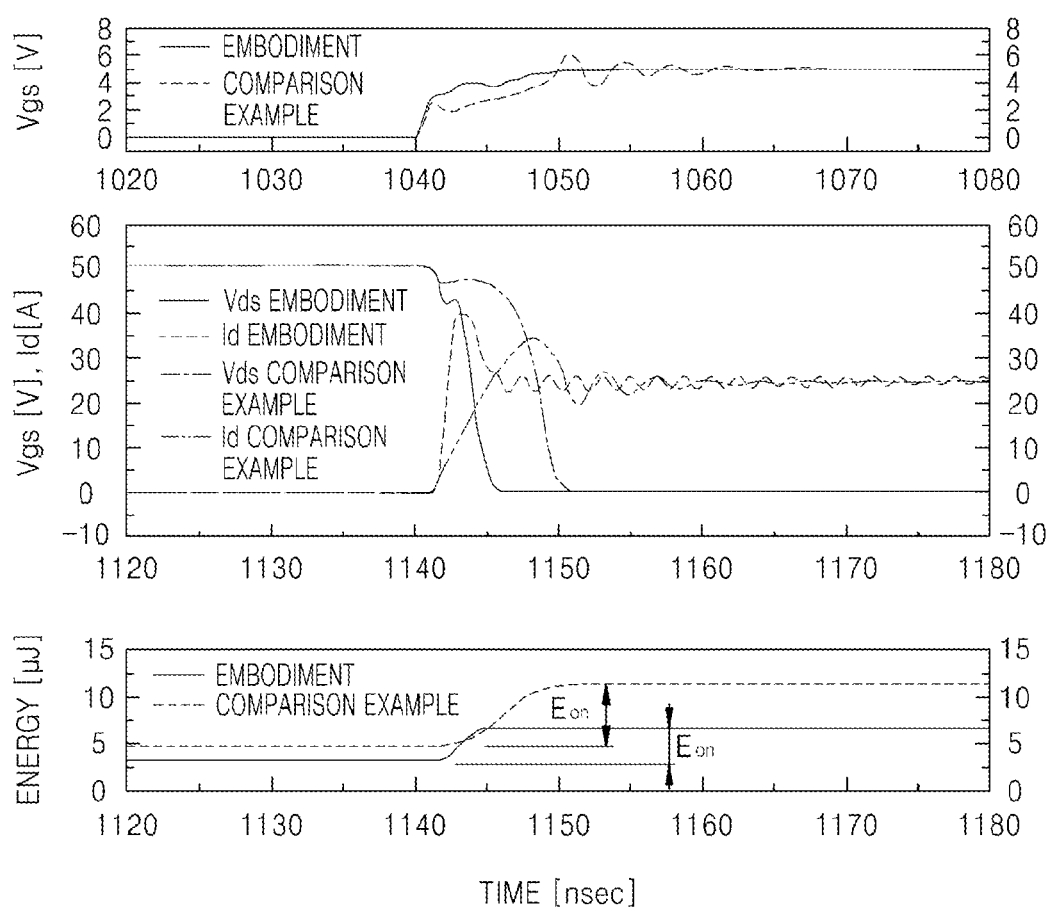
Figure 8B:
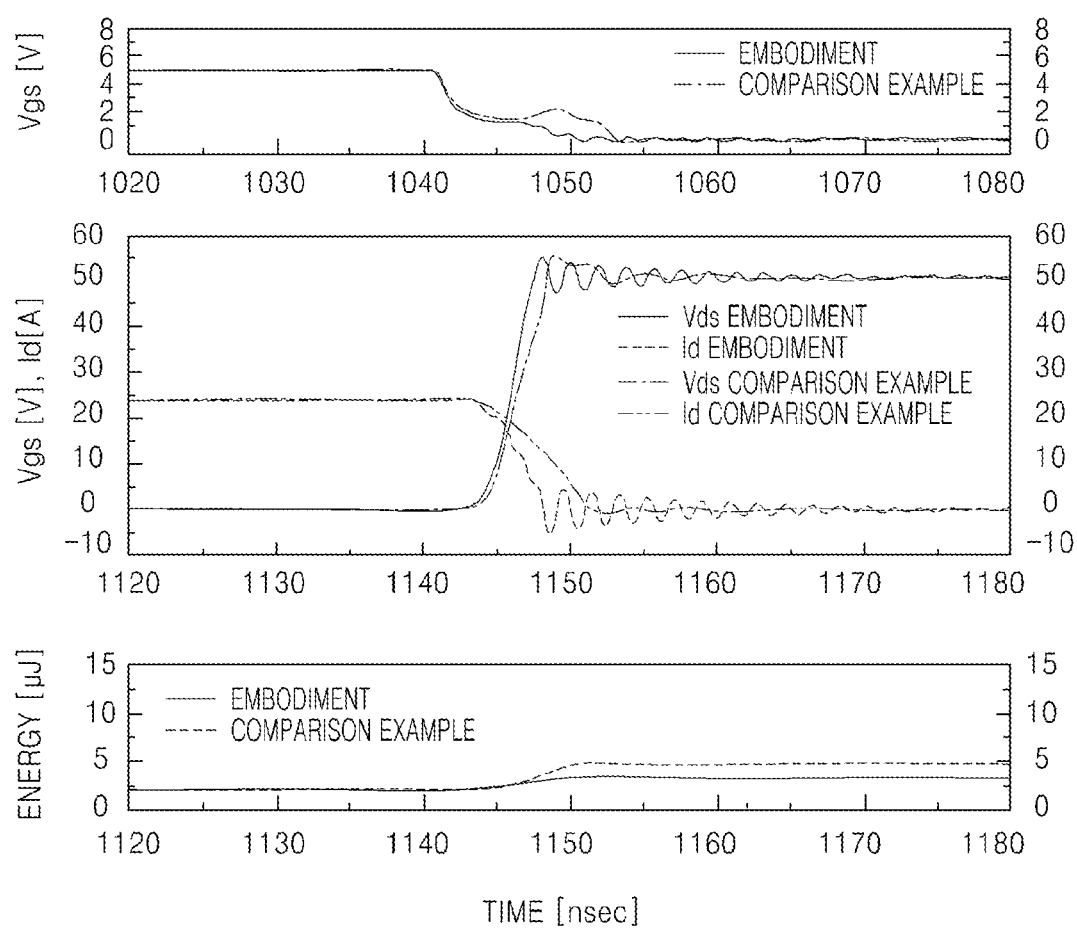
FIG. 8B is a graph showing comparison results between switching characteristics of the semiconductor device of FIG. 6 according to an example embodiment and switching characteristics of the semiconductor device according to the comparison example, when the semiconductor device is switching off.

FIG. 8A is a graph showing comparison results between switching characteristics of the semiconductor device of FIG. 6 according to an example embodiment and switching characteristics of a semiconductor device according to a comparison example, when the semiconductor devices are switching on. FIG. 8B is a graph showing comparison results between switching characteristics of the semiconductor device of FIG. 6 according to an example embodiment and switching characteristics of the semiconductor device according to the comparison example, when the semiconductor devices are switching off.

The graph of FIG. 8A shows results obtained through a circuit simulation by using a clamped inductive load double pulse test circuit using an HBFET of an example embodiment, and the graph of FIG. 8B shows results obtained through a circuit simulation by using a clamped inductive load double pulse test circuit using a HBFET of the comparison example. Values of parasitic components for the circuit simulations were derived through an electromagnetic field simulation using the shapes of the HBFETs.

In the comparison example, two conventional GaN power devices of a land grid array (LGA) package type were used to configure a half bridge structure. Simulations were performed by using the same method with respect to the comparison example and the example embodiment.

Values of parasitic components of the example embodiment and the comparison example, which were derived through an electromagnetic field simulation to perform the circuit simulation, are shown in Table 1.

TABLE 1

| Parasitic component | Comparison example | Example Embodiment | Reduction rate (%) |
|---|---|---|---|
| Ld1 | 0.109 | 0.065 | 39.8 |
| Ls1 | 0.385 | 0.014 | 96.4 |
| Ld2 | 0.021 | 0.014 | 33.3 |
| Ls2 | 0.117 | 0.065 | 44.9 |

Referring to the graphs of FIGS. 8A and 8B, in the case of the example embodiment, a transient period is relatively short in both the turning-on and the turning-off, a switching speed is relatively fast, and an energy loss is relatively small.

Switching characteristics obtained from the graphs of FIGS. 8A and 8B are shown in Table 2.

TABLE 2

| | Comparison example | Example Embodiment | Improvement rate (%) |
|---|---|---|---|
| Td, on[ns] | 1.8 | 1.5 | 16.7 |
| Td, off[ns] | 4.9 | 4.3 | 11.6 |
| Tr [ns] | 2.9 | 0.7 | 75.9 |
| Tf [ns] | 6.1 | 3.9 | 36.1 |
| Eon [μJ] | 6.7 | 3.3 | 50.7 |
| Eoff [μJ] | 2.6 | 1.1 | 57.7 |

In Table 2, Td denotes a delay time, Tr denotes a rise time, Tf denotes a fall time, Eon denotes an energy loss in the turning-on, and Eoff denotes an energy loss in the turning-off.

When comparing the example embodiment with the comparison example, the rise time Tr and the fall time Tf of the embodiment were greatly improved compared to those of the comparison example, and as a result, a switching loss was reduced by about 50%-60%.

Figure 9A:
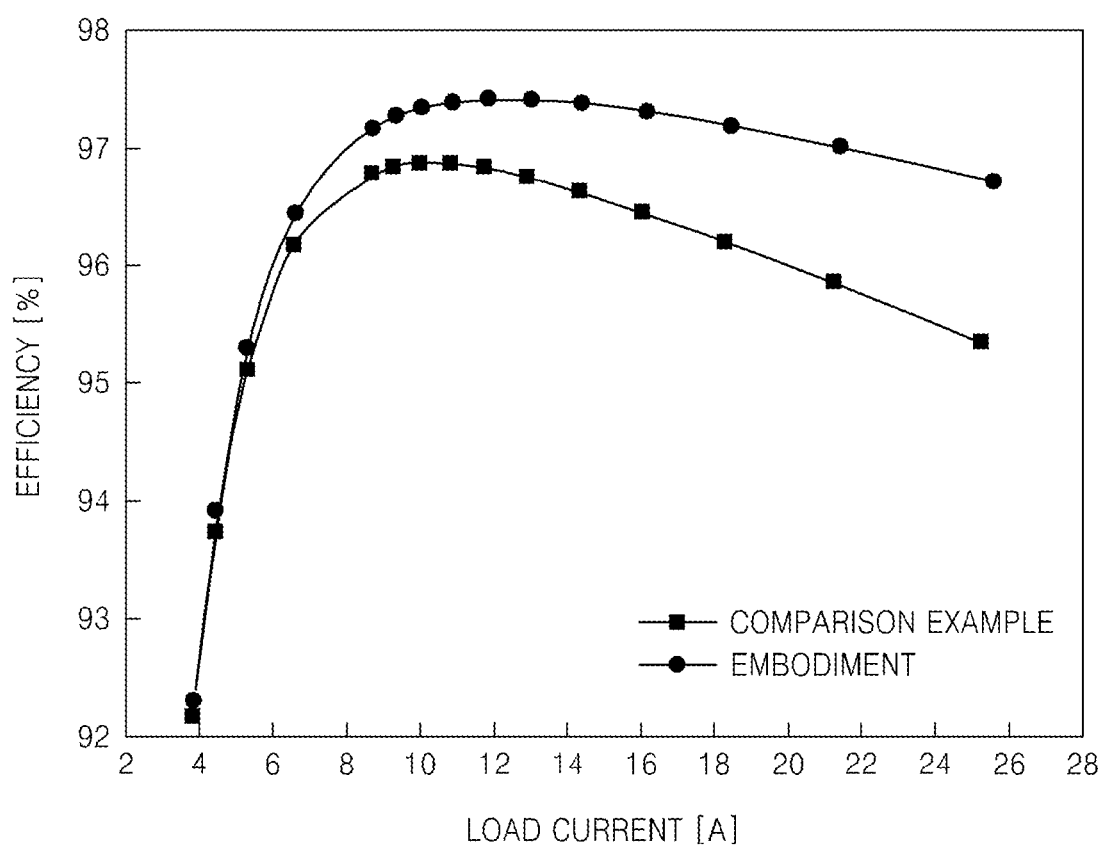
FIG. 9A is a graph showing comparison results between an efficiency of a buck converter using the semiconductor device of FIG. 6 according an example embodiment and an efficiency of a comparison example, with respect to load current.
Figure 9B:
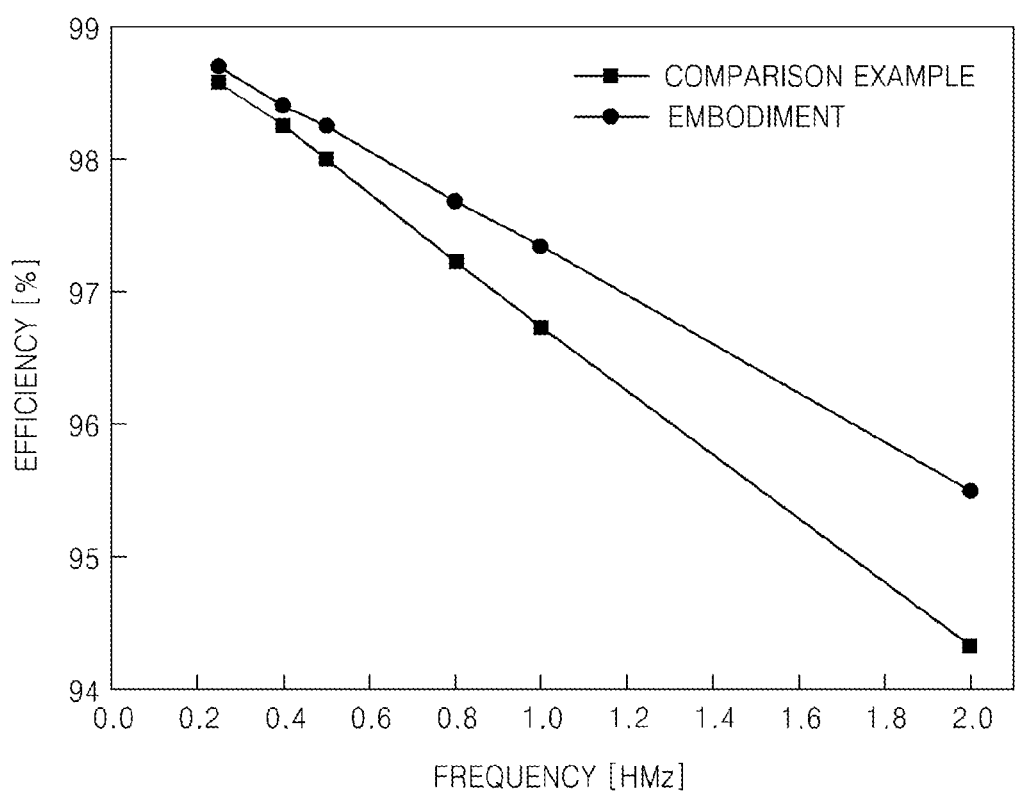
FIG. 9B is a graph showing comparison results between an efficiency of the buck converter using the semiconductor device of FIG. 6 according an example embodiment and an efficiency of the comparison example, with respect to frequency.

FIG. 9A is a graph showing comparison results between an efficiency of a buck converter using the semiconductor device according the above example embodiment and an efficiency of a comparison example, with respect to load current. FIG. 9B is a graph showing comparison results between an efficiency of the buck converter using the semiconductor device according the above example embodiment and an efficiency of the comparison example, with respect to frequency.

The comparison example has a half bridge structure using EPC1001, and the parasitic component values as shown in Table 1 were used to perform a circuit simulation for the example embodiment.

The graph of FIG. 9A shows results tested under the condition in which a load current is changed at a frequency of 1 megahertz (Mhz), and the graph of FIG. 9B illustrates results tested under the condition in which a frequency is changed at a load current of 10 amperes (A). Referring to the graphs, in the example embodiment, a reduction in the efficiency according to an increase of the load current or an increase of the frequency is relatively small.

Figure 10:
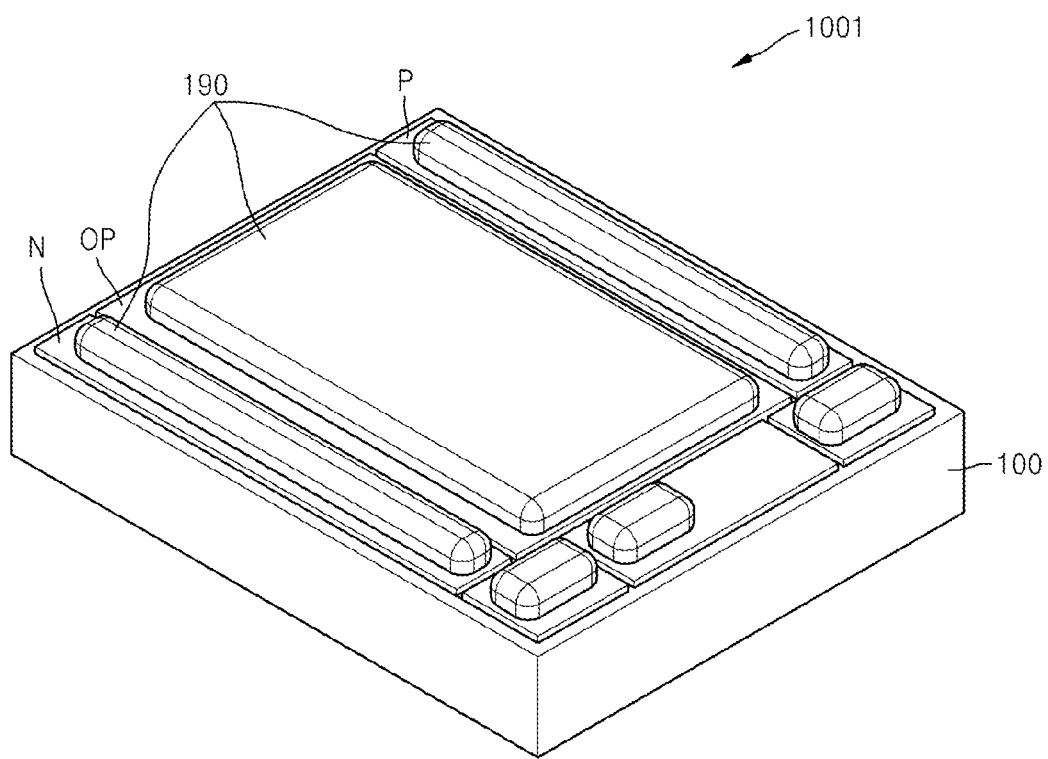
FIG. 10 is a perspective view showing an outward shape of a semiconductor device according to an example embodiment.

FIG. 10 is a perspective view showing an outward shape of a semiconductor device 1001 according to another example embodiment.

The semiconductor device 1001 may be flip chip-bonded to a predetermined board, and as illustrated in FIG. 10, solder bumps 190 may be further formed on a first electrode pad P, an output electrode pad OP, and a second electrode pad N.

A heat occurring when operating the semiconductor device 1001 according to the example embodiment was compared with that of a comparison example through simulations, and Table 3 shows the comparison results.

TABLE 3

| Solder margin | 60 μm | 80 μm | 100 μm | 120 μm |
|---|---|---|---|---|
| Comparison example | 96.9° C. | 97.8° C. | 99.2° C. | 101° C. |
| Example embodiment | 76.5° C. | 76.7° C. | 77° C. | 77.4° C. |

The solder margin denotes a distance between adjacent solder bumps 190. As the solder margin increases, a heating area decreases and thus a maximum temperature increases.

In the case of the example embodiment, when compared with the comparison example, the maximum temperature is relatively low and a level of dependence on the solder margin is very low.

Figure 11A:
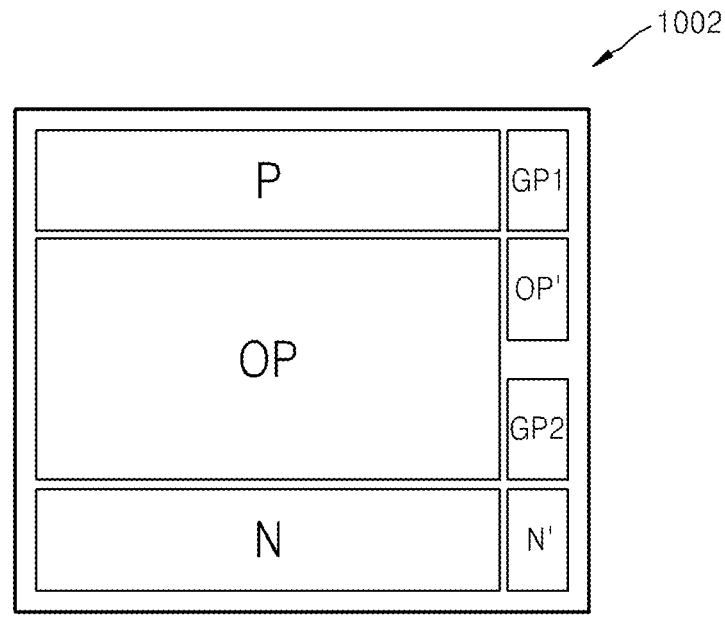
FIGS. 11A through 11C are plan views showing the dispositions of electrode pads of semiconductor devices according to example embodiments.
Figure 11B:
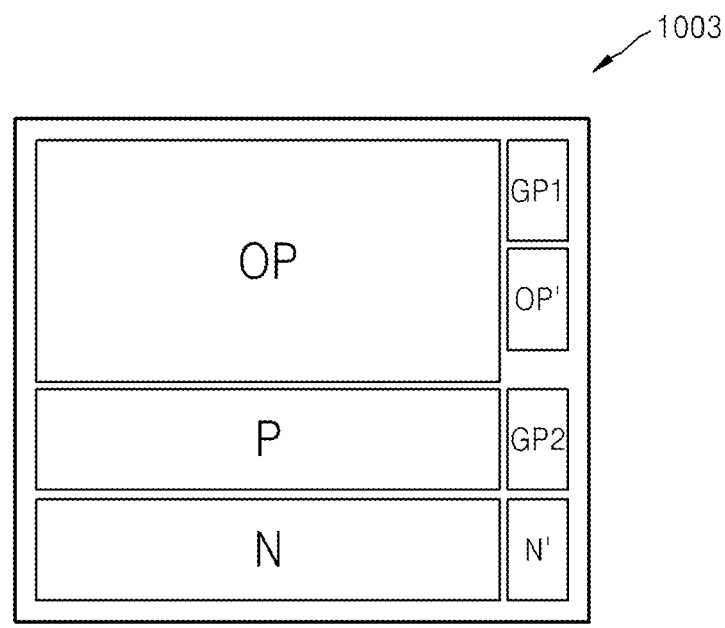
Figure 11C:
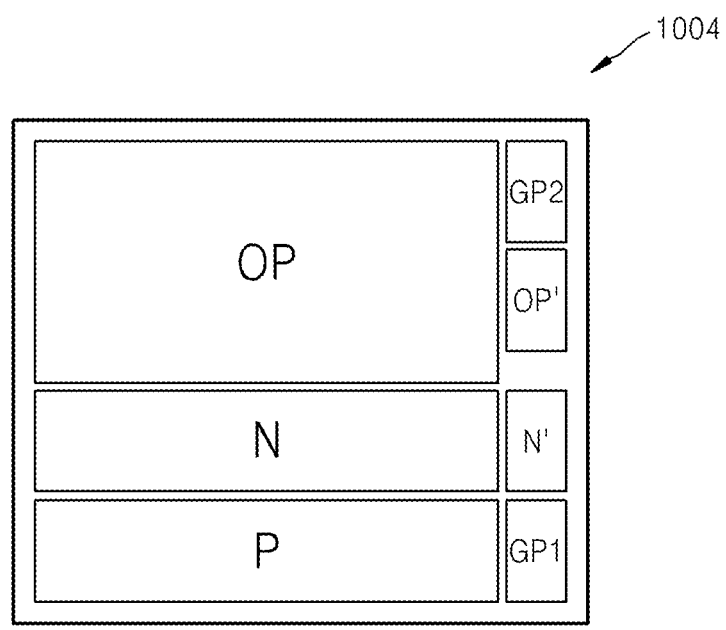

FIGS. 11A through 11C are plan views showing the dispositions of electrode pads of semiconductor devices 1002, 1003, and 1004, according to other example embodiments.

The size or position of a first electrode pad P, the size or position of an output electrode pad OP, and the size or position of a second electrode pad N may be variously changed in consideration of additional parasitic components, the ease of routing, and the like in relation to boards to which the semiconductor devices 1002, 1003, and 1004 are applied.

An element OP' and an element N', illustrated in FIGS. 11A through 11C may be a Kelvin electrode for the output electrode pad OP and a Kelvin electrode for the second electrode pad N, respectively, which are electrodes for control, and are not limited to the forms and positions illustrated in FIGS. 11A through 11C.

FIGS. 12A through 12H are diagrams for explaining a method of manufacturing a semiconductor device, according to an example embodiment. Each of the diagrams includes a perspective view and a cross-sectional view taken along a line D-D' of the perspective view.

The example method uses a method of monolithically forming a stack structure, which implements a half bridge function, on a substrate according to semiconductor processes.

Figure 12A:
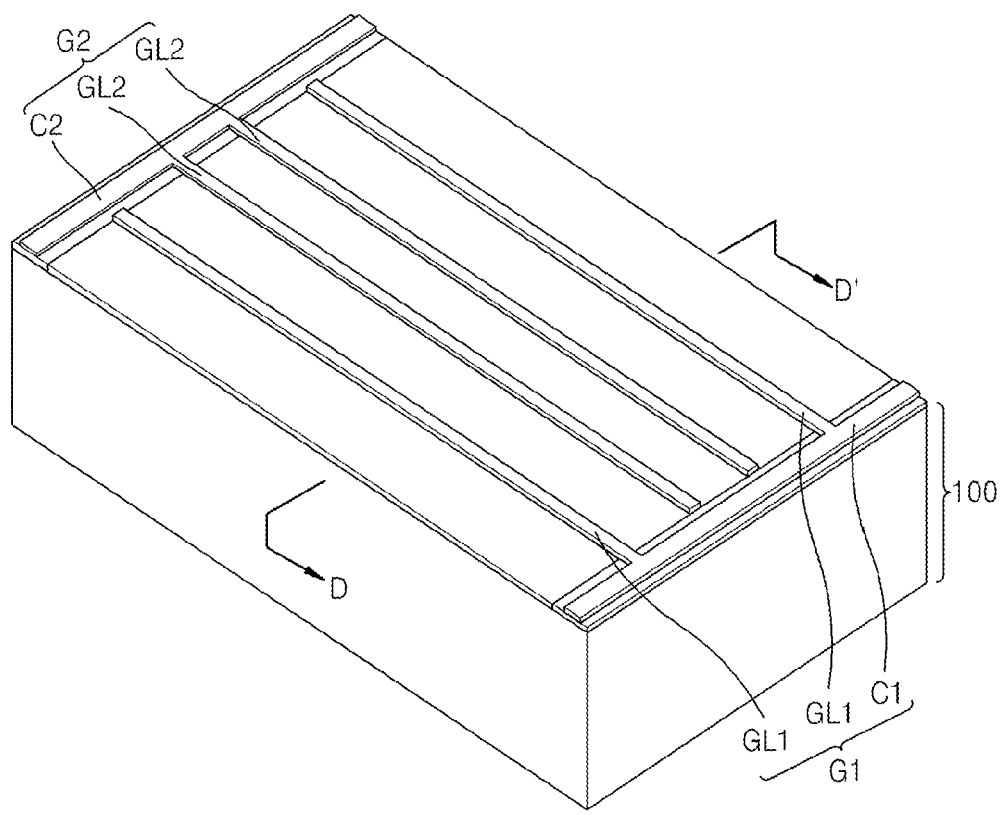
FIGS. 12A through 12H are diagrams for explaining a method of manufacturing a semiconductor device, according to an example embodiment.
Figure 12A:
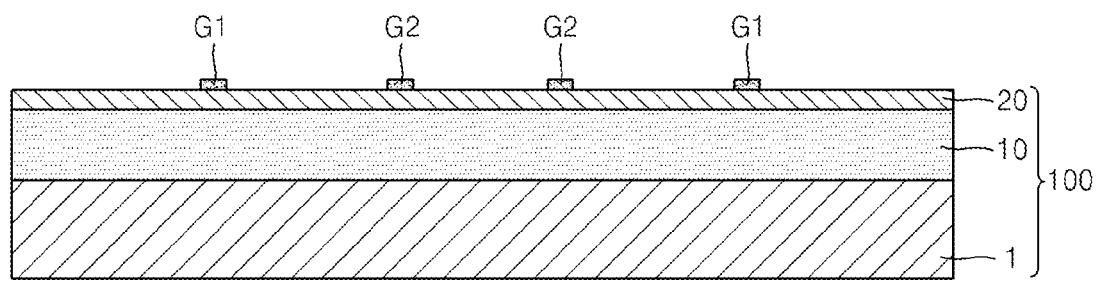

First, as shown in FIG. 12A, a semiconductor substrate 100 is prepared, and a first gate electrode G1 and a second gate electrode G2 are formed on the semiconductor substrate 100.

The semiconductor substrate 100 may include a substrate 1, a first semiconductor layer 10, and a second semiconductor layer 20, and the second semiconductor layer 20 is formed of a material that may induce a 2-dimensional electron gas layer in the first semiconductor layer 10.

The substrate 1 may be a substrate including sapphire, Si, SiC, GaN, or the like.

The first semiconductor layer 10 may include a semiconductor of the III-V group. For example, the semiconductor layer 10 may include GaN, InN, GaAs, and the like. The first semiconductor layer 10 may be an undoped layer or a layer doped with impurities.

The second semiconductor layer 20 may include AlGaN, AlInN, AlGaAs, and the like. AlGaN, AlInN, AlGaAs, and the like have larger polarizability than the first semiconductor layer 10, and thus may induce the 2-dimensional electron gas layer in the first semiconductor layer 10.

According to at least one example embodiment, when the first semiconductor layer 10 is a GaN layer, the second semiconductor layer 20 may be an AlGaN layer or an AlInN layer. When the first semiconductor layer 10 is an InN layer, the second semiconductor layer 20 may be an AlInN layer. When the first semiconductor layer 10 is a GaAs layer, the second semiconductor layer 20 may be an AlGaAs layer. However, the above-stated materials of the first and second semiconductor layers 10 and 20 are examples, and may be variously changed.

The first semiconductor layer 10 and the second semiconductor layer 20 may be formed by epitaxial growth and for example, may be formed by using MOCVD equipment. In addition, before forming the second semiconductor layer 20, the electron density of the 2-dimensional electron gas layer that is induced by the second semiconductor layer 20 may be increased by performing a heat treatment process on the first semiconductor layer 10. A buffer layer 15 may be further provided between the substrate 1 and the semiconductor layer 10. The buffer layer 15 reduces differences in lattice constant and thermal expansion coefficient between the substrate 1 and the first semiconductor layer 10 to prevent the deterioration of the crystallinity of the first semiconductor layer 10. The buffer layer 15 may be formed of, for example, AlN, GaN, AlGaN, AlInN, AlGaInN, and the like.

A first gate electrode G1 and a second gate electrode G2 are formed on the semiconductor substrate 100. The first gate electrode G1 may include a plurality of first gate lines GL1 spaced apart from one another, and may further include a first connection portion C1 that connects the plurality of first gate lines GL1 to one another. The second gate electrode G2 also may include a plurality of second gate lines GL2 spaced apart from one another, and may further include a second connection portion C2 that connects the plurality of second gate lines GL1 to one another.

The plurality of first gate lines GL1 and the plurality of second gate lines GL2 are disposed to be interlocked with each other, and may be disposed to be interlocked with each other by groups of two gate lines as illustrated in FIG. 12A. Accordingly, a drain electrode, the first gate electrode G1, an output electrode O, the second gate electrode G2, and a source electrode are mirror-symmetrically and repeatedly formed. The form in which the plurality of first gate lines GL1 and the plurality of second gate lines GL2 are interlocked with each other may be variously changed to create another form of electrode disposition.

The plurality of first gate lines GL1 and the plurality of second gate lines GL2 may be formed by using metal deposition and/or photolithography. A metal material having high electric conductivity, e.g., Pt, Ru, Au, Ag, Mo, Al, W, Cu, or the like may be used as the material of the first and second gate electrodes G1 and G2.

Figure 12B:
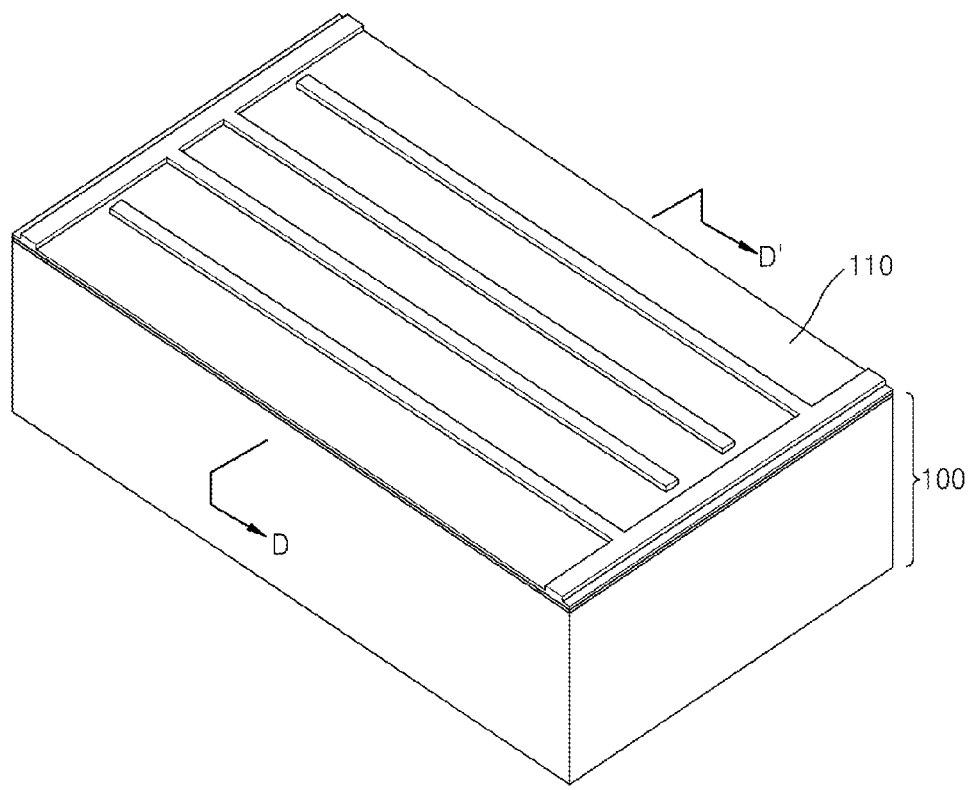
Figure 12B:
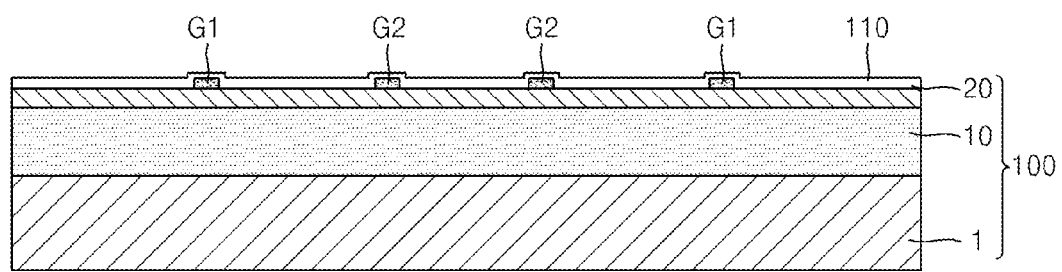

Referring to FIG. 12B, a passivation layer 110 entirely covering the first and second gate electrodes G1 and G2 is formed. Various kinds of insulating materials may be used as the material of the passivation layer 110. For example, a silicon nitride or a silicon oxide may be used as the material of the passivation layer 110. Alternatively, $SiO_2$, $HfO_2$, $Al_2O_3$, $Si_3N_4$, or a mixture thereof may be used as the material of the passivation layer 110. Such an insulating material may be deposited on the first and second gate electrodes G1 and G2 to form the passivation layer 110.

Figure 12C:
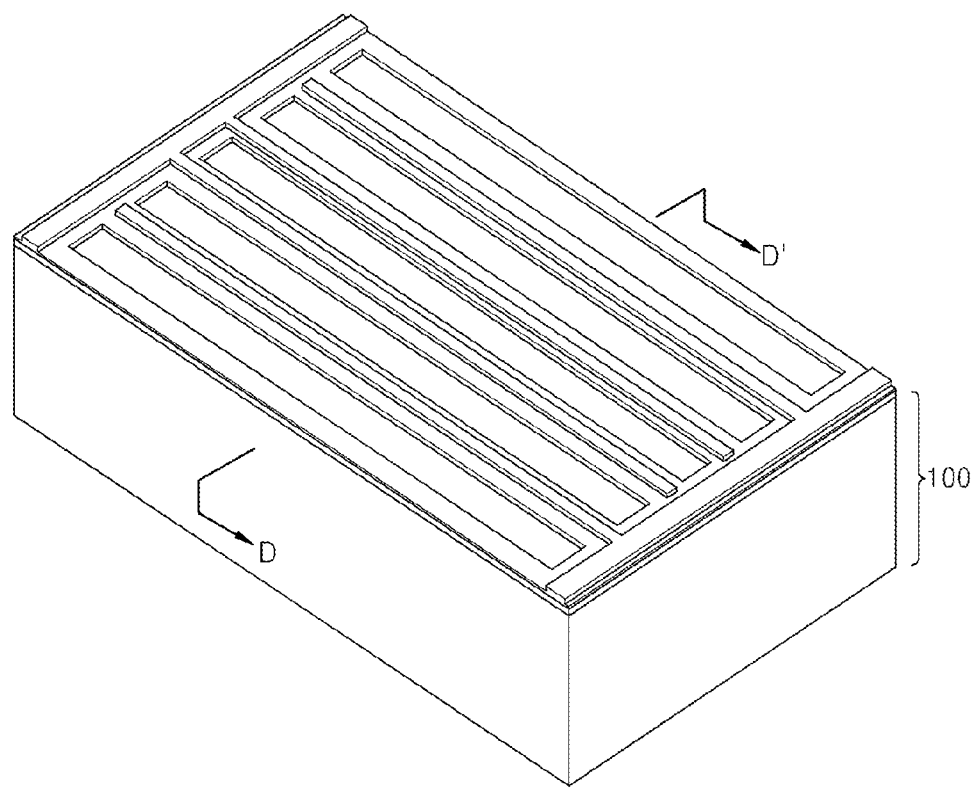
Figure 12C:
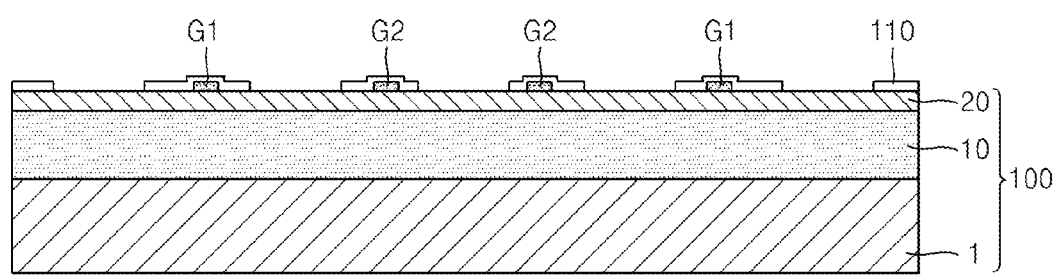

Referring to FIG. 12C, the passivation layer 110 is patterned to expose the second semiconductor layer 20. A general photolithography process may be used to pattern the passivation layer 110.

Figure 12D:
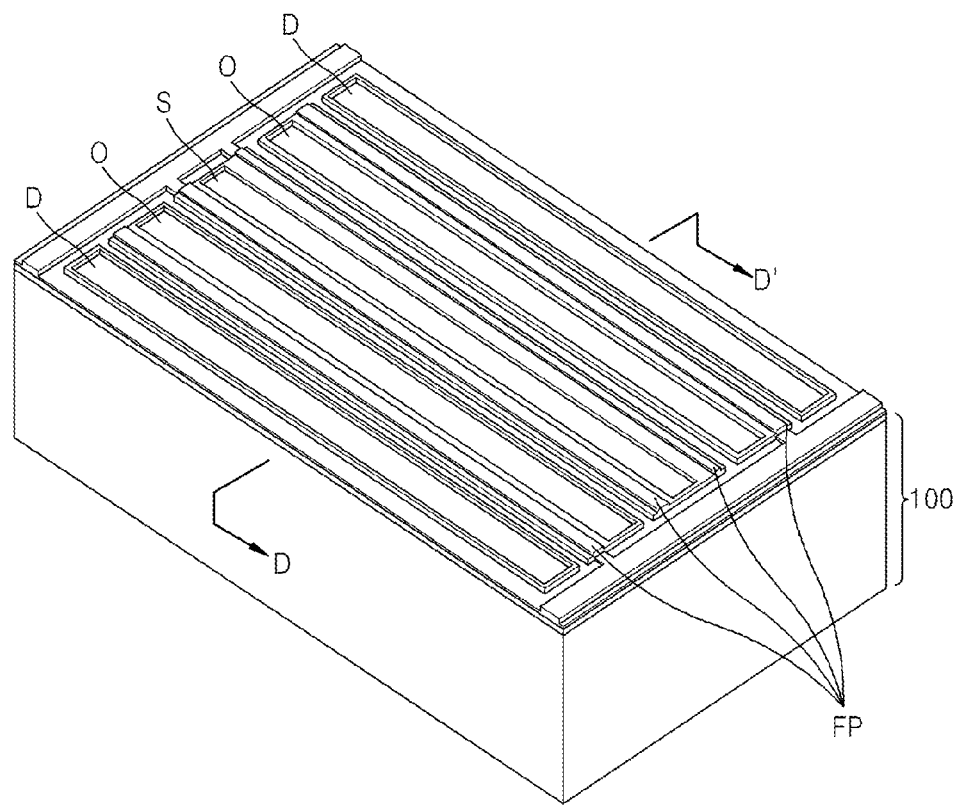
Figure 12D:
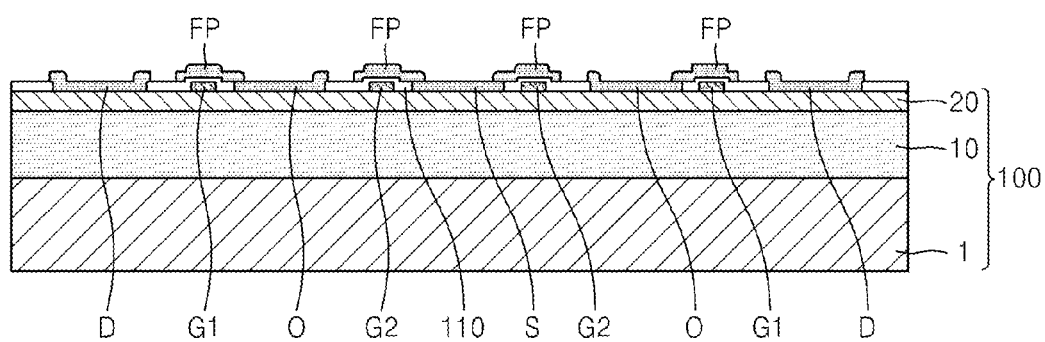

Referring to FIG. 12D, a drain electrode D, an output electrode O, a source electrode S, and a field plate FP are formed. A metal deposition process and a photolithography process may be used to form such a structure.

Figure 12E:
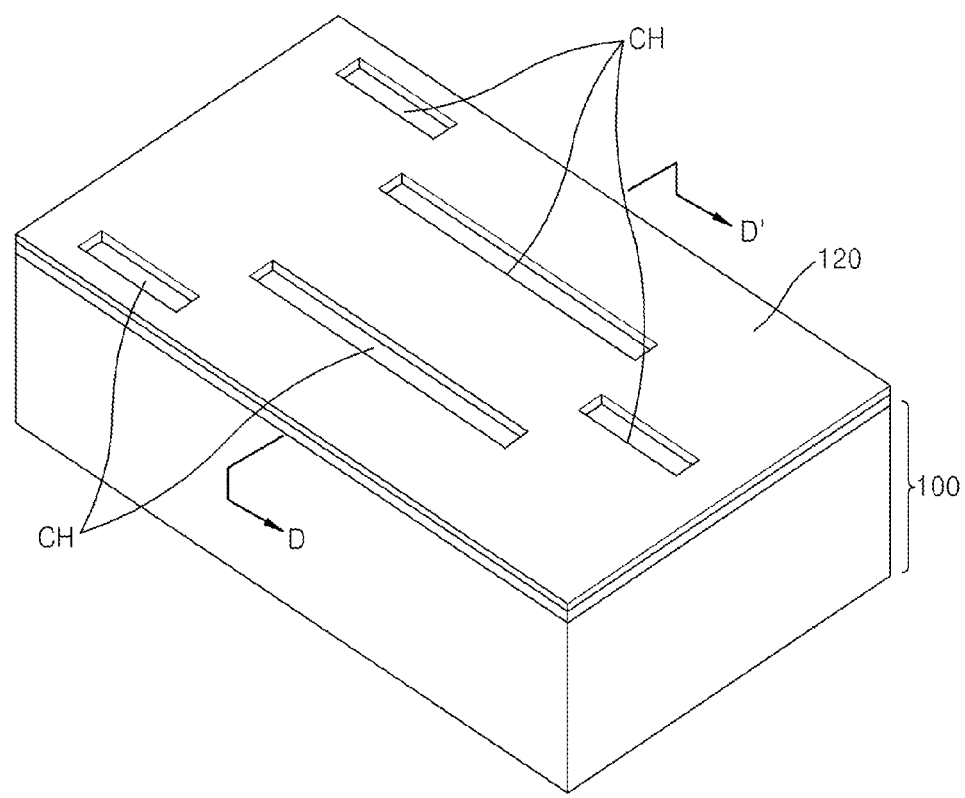
Figure 12E:
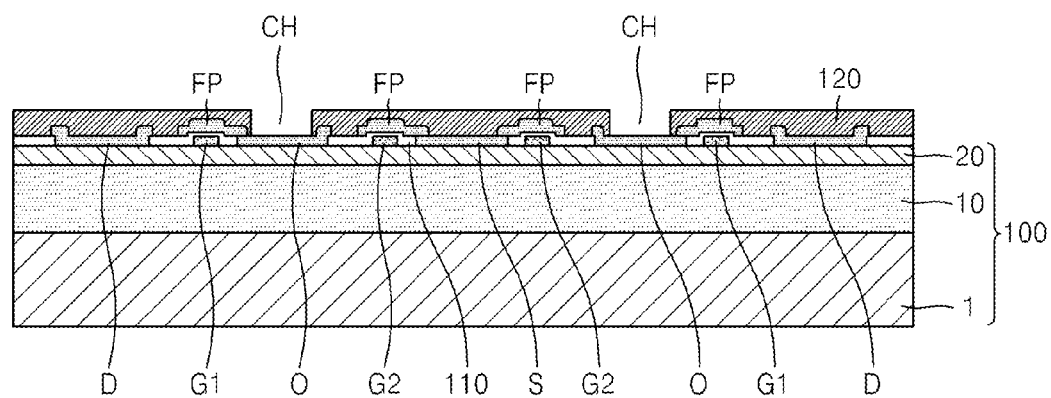

Referring to FIG. 12E, an insulating layer 120 entirely covering the structure of FIG. 12D is formed, and a plurality of contact holes CH are formed in the insulating layer 120. The insulating layer 120 may be formed by depositing a silicon nitride or a silicon oxide, e.g., $SiO_2$, $HfO_2$, $Al_2O_3$, $Si_3N_4$, or a mixture thereof. After forming the insulating layer 120, which entirely covers the drain electrode D, the field plate FP, the output electrode O, the source electrode S, and the passivation layer 110, the plurality of contact holes CH may be formed by using an etching process. However, the example embodiments are not limited thereto.

The plurality of contact holes CH may be formed in a required position as many as necessary in consideration of an electrode pad and an electrode connected thereto. The positions and sizes of the contact holes CH illustrated in FIG. 12E are just examples, and may be changed to modify the forms of the electrode pads P, OP, and N, and the form of the electrodes OP' and N', illustrated in FIGS. 11A through 11C.

Although not illustrated, a plurality of contact holes may be further formed to form a gate pad for inputting an electrical control signal to the first and second gate electrodes G1 and G2. Such contact holes may be formed to open the first connection portion C1 of the first gate electrode G1 and the second connection portion C2 of the second gate electrode G2, which are illustrated in FIG. 12A.

Figure 12F:
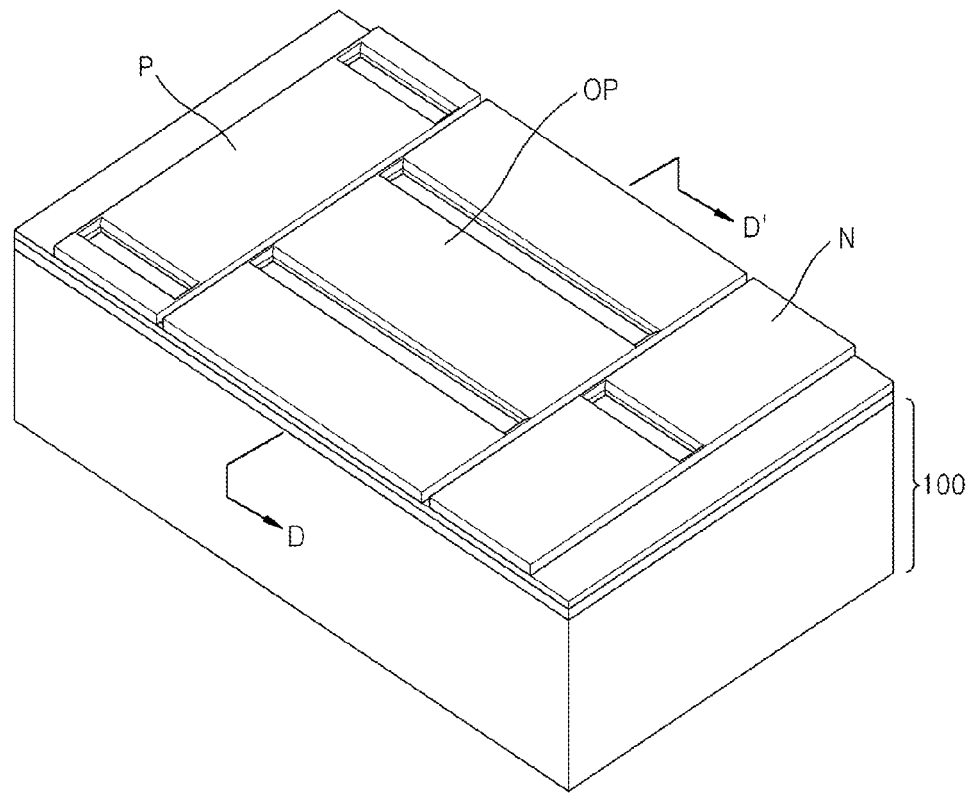
Figure 12F:
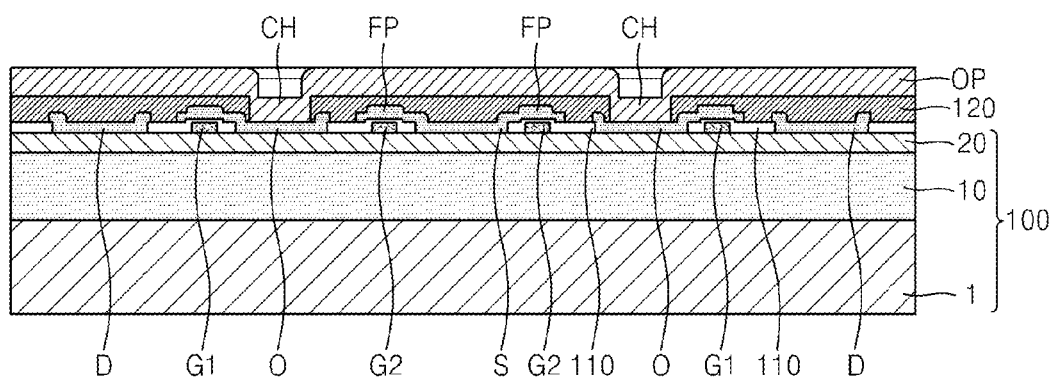

As shown in FIG. 12F, a first electrode pad P, an output electrode pad OP, and a second electrode pad N are formed. The first electrode pad P is connected to the drain electrodes D through contact holes CH corresponding thereto, the output electrode pad OP is connected to the output electrodes O through the contact holes CH corresponding thereto, and the second electrode pad N is connected to the source electrodes S through contact holes CH corresponding thereto. In addition, although not illustrated, gate pads, which are connected to the first gate electrode G1 and the second gate electrode G2, may be further formed together with the first electrode pad P, the output electrode pad OP, and the second electrode pad N.

Figure 12G:
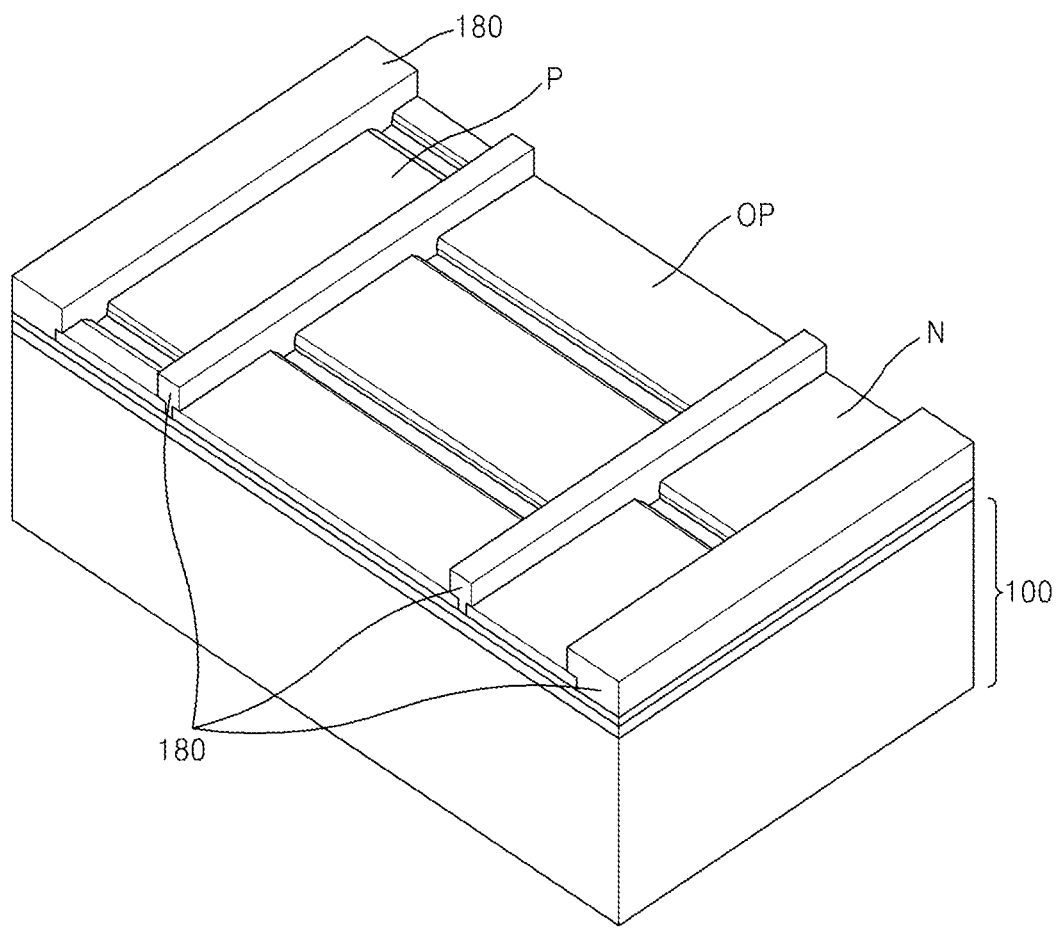

As shown in FIG. 12G, an insulating partition 180 may be further formed between each of the pads, i.e., between the first electrode pad P, the output electrode pad OP, and the second electrode pad N. The insulating partition 180 may be formed of polyimide, and may be formed to have a height that is greater than the heights of the first electrode pad P, the output electrode pad OP, and the second electrode pad N in order to prevent a short between adjacent solder bumps when forming the solder bumps.

Figure 12H:
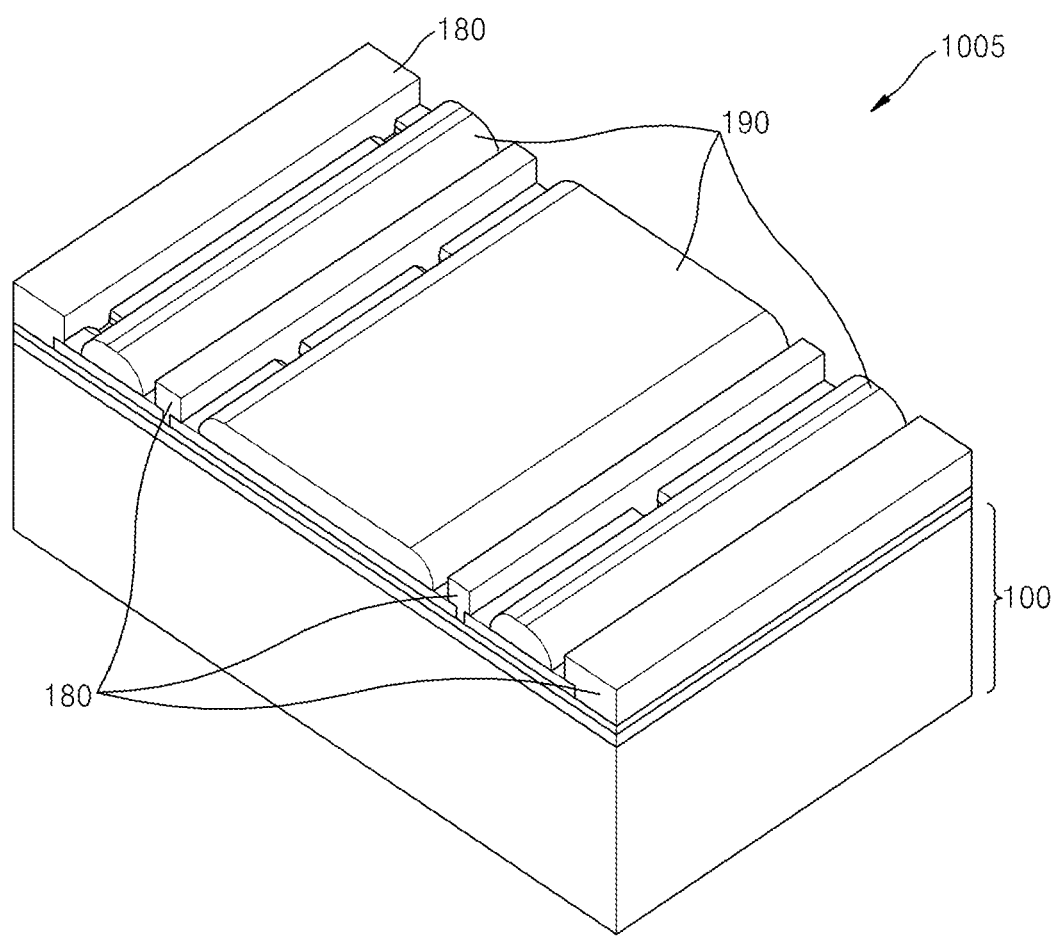

Next, as shown in FIG. 12H, a solder bump 190 may be further formed to obtain a structure that may be easily flip chip-bonded onto a board.

Figure 13:
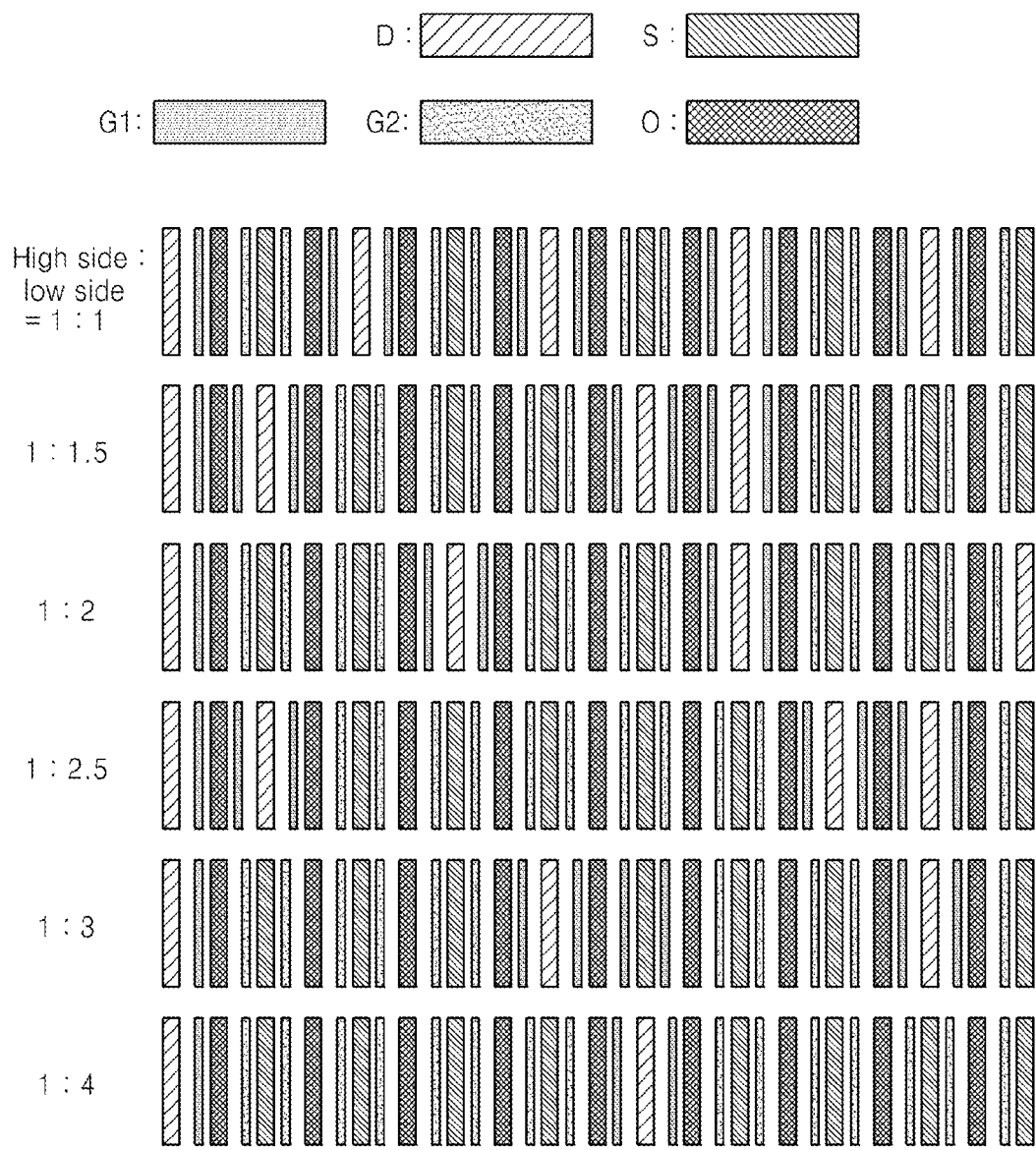
FIG. 13 is a diagram illustrating a structure that may be adopted in a semiconductor device according to an example embodiment, and shows various examples in which a drain electrode, a first gate electrode, an output electrode, a second gate electrode, and a source electrode are disposed.

FIG. 13 is a diagram illustrating a structure that may be adopted in a semiconductor device according to another example embodiment, and shows various examples in which a drain electrode D, a first gate electrode G1, an output electrode O, a second gate electrode G2, and a source electrode S are disposed.

According to at least one example embodiment, two switches forming an HBFET may be formed to have different channel areas according to the application of the HBFET. A transistor, which forms a switch of a high side connected to a relatively high electrical signal, and a transistor, which forms a switch of a low side connected to the ground or a relatively low electrical signal, may have different channel areas. For example, when the HBFET is used in a buck converter, the switch of the high side connected to the relatively high electrical signal is formed to have a size that is larger than the size of the switch of the low side connected to the ground or the relatively low electrical signal.

A channel area ratio may be changed by changing the number of drain electrodes D to be disposed and the number of source electrodes S to be disposed. FIG. 13 illustrates the case in which the channel area ratio of the switch of the high side to the switch of the low side is 1:1, 1:1.5, 1:2, 1:2.5, 1:3, or 1:4.

According to the example semiconductor device described above and the example method of manufacturing the semiconductor device, a monolithic HBFET having a structure integrated on a single semiconductor substrate is provided.

Accordingly, the example semiconductor device has reduced parasitic inductance, and thus, may perform a half bridge function with high efficiency and may be applied to various power devices.

It should be understood that the example embodiments described therein should be considered in a descriptive sense only and not for purposes of limitation. Descriptions of features or aspects within each example embodiment should typically be considered as available for other similar features in other embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A semiconductor device comprising:
a substrate;
a first semiconductor layer on the substrate;
a second semiconductor layer on the first semiconductor layer, the second semiconductor layer inducing a 2-dimensional electron gas layer in the first semiconductor layer;
a first drain electrode, a first source electrode, and a first gate electrode on the second semiconductor layer and constituting a first transistor including the 2-dimensional electron gas layer;
a second drain electrode, a second source electrode, and a second gate electrode on the second semiconductor layer and constituting a second transistor including the 2-dimensional electron gas layer; and
an output electrode including the first source electrode and the second drain electrode.

2. The semiconductor device of claim 1, wherein the first transistor, the output electrode, and the second transistor constitute a half-bridged field effect transistor (HBFET) cell.

3. The semiconductor device of claim 2, wherein the HBFET cell comprises a plurality of HBFET cells, and
wherein the plurality of HBFET cells are configured to implement an integrated HBFET.

4. The semiconductor device of claim 2, wherein
the first drain electrode, the first gate electrode, the output electrode, the second gate electrode, and the second source electrode constitute a pentode unit, and
a plurality of pentode units are provided on the substrate.

5. The semiconductor device of claim 4, further comprising:
a first electrode pad configured to connect drain electrodes of a plurality of first transistors included in the plurality of pentode units to one another;
an output electrode pad configured to connect a plurality of output electrodes included in the plurality of pentode units to one another; and
a second electrode pad configured to connect source electrodes of a plurality of second transistors included in the plurality of pentode units to one another.

6. The semiconductor device of claim 5, further comprising an insulating layer substantially entirely covering the plurality of pentode units,
wherein the drain electrodes of the plurality of first transistors, the plurality of output electrodes, and the source electrodes of the plurality of second transistors are connected to the first electrode pad, the output electrode pad, and the second electrode pad, respectively, through contact holes penetrating the insulating layer.

7. A semiconductor device comprising:
a semiconductor substrate with a 2-dimensional electron gas layer formed therein;
first and second gate electrodes on the semiconductor substrate, wherein the first gate electrode comprises a plurality of first gate lines spaced apart from one another, and the second gate electrode comprises a plurality of second gate lines interlocked with the plurality of first gate lines;
a plurality of first drain electrodes and first source electrodes, which constitute a plurality of first transistors having the plurality of first gate lines and the 2-dimensional electron gas layer;
a plurality of second drain electrodes and second source electrodes, which constitute a plurality of second transistors having the plurality of second gate lines and the 2-dimensional electron gas layer;
wherein the plurality of first drain electrodes and first source electrodes and the plurality of second drain electrodes and second source electrodes are disposed on a plurality of areas between the plurality of first and second gate lines.

8. The semiconductor device of claim 7, further comprising an output electrode including a source electrode of a first transistor and an adjacent drain electrode of a second transistor in the plurality of first transistors and the plurality of second transistors.

9. The semiconductor device of claim 8, wherein the plurality of first transistors, a plurality of output electrodes, and the plurality of second transistors constitute an integrated half bridge cell.

10. The semiconductor device of claim 9, wherein the first gate electrode further comprises a first connection portion configured to connect ends of the plurality of first gate lines to one another, and the second gate electrode further comprises a second connection portion configured to connect ends of the plurality of second gate lines to one another.

11. The semiconductor device of claim 10, further comprising:
a first electrode pad to which the first drain electrodes are connected;
an output electrode pad to which the plurality of output electrodes are connected; and
a second electrode pad to which the second source electrodes are connected.

12. The semiconductor device of claim 11, further comprising:
a first gate pad connected to the first connection portion; and
a second gate pad connected to the second connection portion.

13. The semiconductor device of claim 7, further comprising:
a passivation layer substantially entirely covering the first gate electrode and the second gate electrode, and
a field plate extending from any one of a drain electrode, an output electrode, and a source electrode onto the passivation layer on an adjacent first gate line or adjacent second gate line.

14. The semiconductor device of claim 7, wherein the semiconductor substrate comprises:
a substrate;
a first semiconductor layer on the substrate;
a second semiconductor layer on the first semiconductor layer, the second semiconductor layer inducing the 2-dimensional electron gas layer in the first semiconductor layer.

15. The semiconductor device of claim 14, wherein the first semiconductor layer comprises at least one of GaN, InN, and GaAs; and
wherein the second semiconductor layer comprises at least one of AlGaN, AlInN, and AlGaAs.

16. The semiconductor device of claim 15, further comprising a buffer layer between the substrate and the first semiconductor layer.

17. The semiconductor device of claim 1, wherein the first semiconductor layer comprises at least one of GaN, InN, and GaAs; and
wherein the second semiconductor layer comprises at least one of AlGaN, AlInN, and AlGaAs.

18. The semiconductor device of claim 7, wherein at least two first gate lines are between the second gate lines.

* * * * *